United States Patent
Inagaki et al.

(10) Patent No.: US 6,733,585 B2
(45) Date of Patent: May 11, 2004

(54) APPARATUS FOR PULLING SINGLE CRYSTAL BY CZ METHOD

(75) Inventors: Hiroshi Inagaki, Kanagawa (JP);
Shigeki Kawashima, Kanagawa (JP);
Makoto Kamogawa, Kanagawa (JP);
Tadashi Hata, Ehime (JP)

(73) Assignee: Komatsu Denshi Kinzoku Kabushiki Kaisha, Kanagawa (JP)

( * ) Notice: Subject to any disclaimer, the term of this patent is extended or adjusted under 35 U.S.C. 154(b) by 0 days.

(21) Appl. No.: 09/775,287

(22) Filed: Feb. 1, 2001

(65) Prior Publication Data

US 2002/0144641 A1 Oct. 10, 2002

(30) Foreign Application Priority Data

| Feb. 1, 2000 | (JP) | 2000-023527 |
| Feb. 29, 2000 | (JP) | 2000-054893 |
| Feb. 29, 2000 | (JP) | 2000-054894 |
| Feb. 29, 2000 | (JP) | 2000-054895 |
| Feb. 29, 2000 | (JP) | 2000-054896 |

(51) Int. Cl.⁷ .................................................. C30B 15/20
(52) U.S. Cl. ...................... 117/13; 117/14; 117/15; 117/200; 117/201; 117/202; 117/208; 117/213; 117/217; 117/222; 117/911
(58) Field of Search .............. 117/13, 14, 15, 117/200, 201, 202, 208, 213, 217, 222, 911

(56) References Cited

U.S. PATENT DOCUMENTS 5,865,887 A * 2/1999 Wijaranakula et al. ....... 117/34
5,900,059 A * 5/1999 Shimanuki et al. .......... 117/217
6,090,198 A * 7/2000 Aydelott .................... 117/13
6,117,402 A * 9/2000 Kotooka et al. .......... 422/245.1

FOREIGN PATENT DOCUMENTS

| JP | 45889/1981 | 4/1981 |
| JP | 217493/1983 | 12/1983 |
| JP | 80338/1991 | 12/1991 |
| JP | 317491/1992 | 11/1992 |
| JP | 239291/1996 | 9/1996 |
| JP | 10-098047 | 4/1998 |
| JP | 10-208987 | 8/1998 |
| JP | 11-092272 | 4/1999 |
| JP | 11-189488 | 7/1999 |
| JP | 2000-154095 | 6/2000 |
| JP | 2000-264779 | 9/2000 |

OTHER PUBLICATIONS

William C. Dash, "Growth of Silicon Crystals Free from Dislocations"; *Journal of Applied Physics*; Apr. 1959; vol. 30, No. 4; pp. 459–474.

* cited by examiner

*Primary Examiner*—Felisa Hiteshew
(74) *Attorney, Agent, or Firm*—Welsh & Katz, Ltd.

(57) ABSTRACT

In a Czochralski (CZ) single crystal puller equipped with a cooler and a thermal insulation member, which are to be disposed in a CZ furnace, smooth recharge and additional charge of material are made possible. Further, elimination of dislocations from a silicon seed crystal by use of the Dash's neck method can be performed smoothly. To these ends, there is provided a CZ single crystal puller, wherein a cooler and a thermal insulation member are immediately moved upward away from a melt surface during recharge or additional charge of material or during elimination of dislocations from a silicon seed crystal by use of the Dash's neck method.

19 Claims, 23 Drawing Sheets

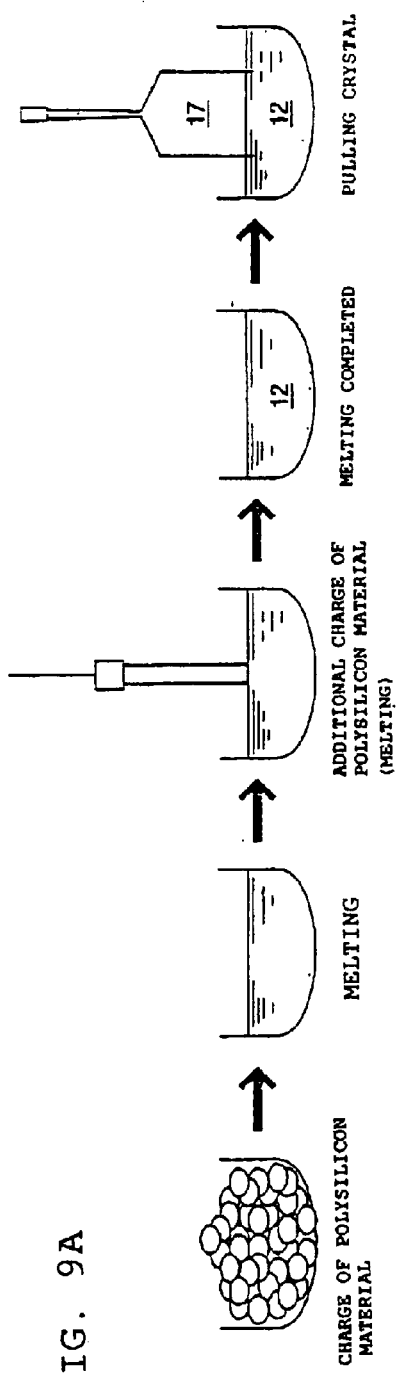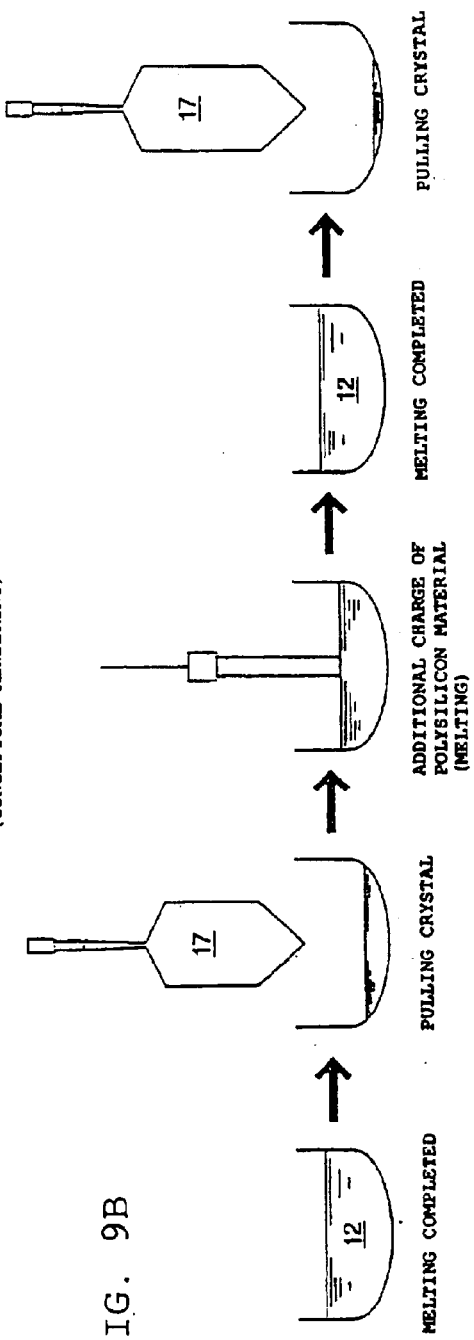
FIG. 9A — ADDITIONAL CHARGE PROCESS FLOW (CONCEPTUAL RENDERING)
FIG. 9B — RECHARGE PROCESS FLOW (CONCEPTUAL RENDERING)

RELATIONSHIP BETWEEN CONCENTRATION OF NITROGEN AND DEFECT DENSITY

RELATIONSHIP BETWEEN CONCENTRATION OF NITROGEN AND DEFECT SIZE

FIG. 21A

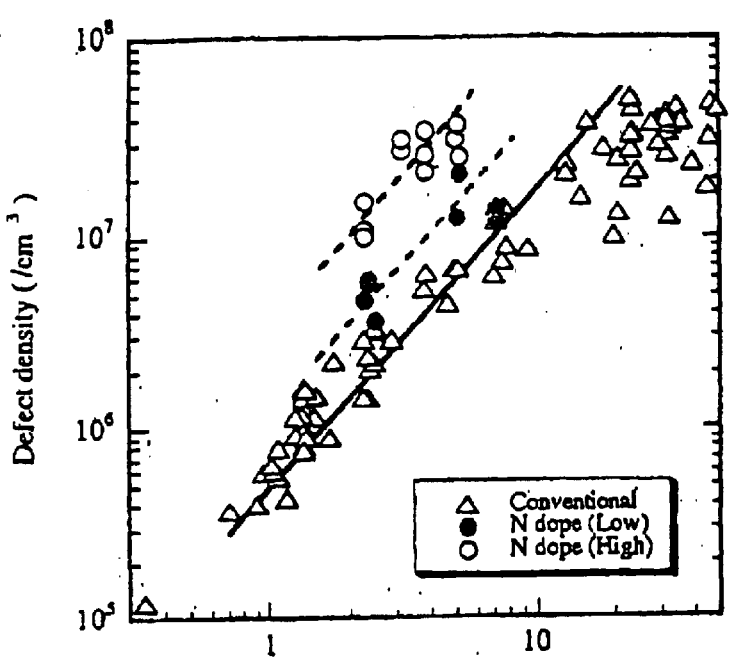

Cooling Rate at defect formation temperature ( °C/min)
RELATIONSHIP BETWEEN COOLING RATE AND DEFECT DENSITY AT DEFECT FORMATION TEMPERATURE RANGE (0 - 1120°C)
N dope : Low = 1~3x10$^{14}$ atoms/cm$^3$, High = 5x10$^{14}$~1x10$^{15}$ atoms/cm$^3$

FIG. 21B

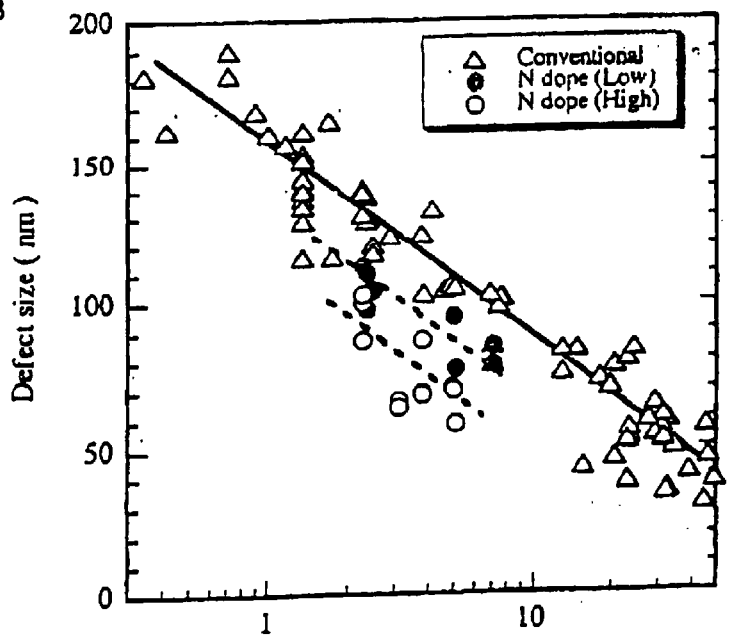

Cooling Rate at defect formation temperature ( °C/min)
RELATIONSHIP BETWEEN COOLING RATE AND DEFECT SIZE AT DEFECT FORMATION TEMPERATURE RANGE (0 - 1120°C)
N dope : Low = 1~3x10$^{14}$ atoms/cm$^3$, High = 5x10$^{14}$~1x10$^{15}$ atoms/cm$^3$

INFLUENCE OF MAGNETIC FIELD ON
CRYSTAL GROWTH RATE AND DEFECT SIZE

FIG. 23

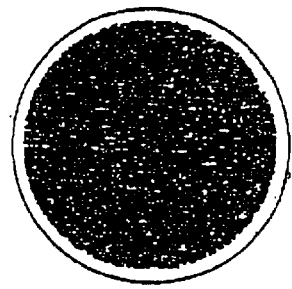

RELATED-ART WAFER
(NO HIGH-TEMPERATURE ANNEALING)
DEFECT DENSITY: 184 DEFECTS/cm²

↓ HIGH-TEMPERATURE HEAT TREATMENT
(1200°C, ATMOSPHERIC PRESSURE, 100% NITROGEN ATMOSPHERE)

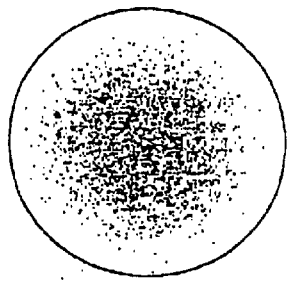

RELATED-ART WAFER HAVING BEEN SUBJECTED
TO HIGH-TEMPERATURE TREATMENT FOR ONE
HOUR, DEFECT DENSITY: 23.4 DEFECTS/cm²

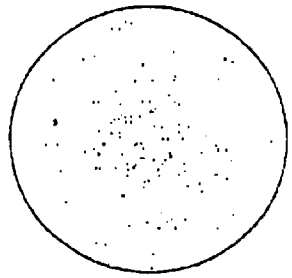

IMPROVED WAFER HAVING BEEN SUBJECTED TO
HIGH-TEMPERATURE TREATMENT FOR TWO
HOURS (IMPROVED THERMAL INSULATOR),
DEFECT DENSITY: 2.46 DEFECTS/cm²

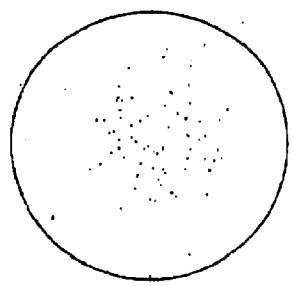

WAFER 1 PRODUCED ACCORDING TO THE INVENTION
THROUGH ONE-HOUR, HIGH-TEMPERATURE
TREATMENT (WITH COOLER),
DEFECT DENSITY: 0.967 DEFECTS/cm²

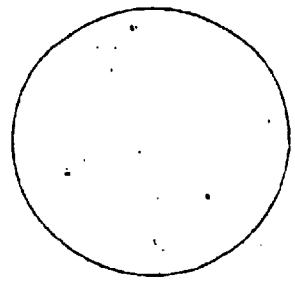

WAFER 2 PRODUCED ACCORDING TO THE INVENTION
THROUGH ONE-HOUR, HIGH-TEMPERATURE
TREATMENT (WITH COOLER AND NITROGEN)
DEFECT DENSITY: 0.579 DEFECTS/cm²

LASER SCATTERING MAPS AND DEFECT DENSITIES
OF ANNEALED SURFACE LAYERS OF VARIOUS TYPES
(5 μm)

APPARATUS FOR PULLING SINGLE CRYSTAL BY CZ METHOD

BACKGROUND OF THE INVENTION

1. Field of the Invention

The present invention relates to an apparatus for pulling single crystal by Czochralski (CZ) method (a Czochralski (CZ) single crystal puller) equipped with a cooler for cooling a pulled single crystal.

Further, the present invention relates to a CZ single crystal puller which is equipped with a cooler for cooling a pulled single crystal and which can smoothly eliminate dislocations from a silicon seed crystal by means of the Dash's neck method.

The present invention also relates to a CZ single crystal puller which is equipped with a cooler for cooling a pulled single crystal and which can smoothly perform recharging and additional charging operations.

The present invention further relates to a CZ single crystal puller which is equipped with a cooler for cooling a pulled single crystal and a safety mechanism for avoiding hazard, which would result from installation of the cooler.

The present invention further relates to a technique for optimizing requirements for manufacturing a silicon wafer to be produced by the Czochralski (CZ) method.

2. Related Art

As a CZ single crystal puller which pulls a single crystal by means of the Czochralski (CZ) method, a CZ single crystal puller equipped with a cooler to be disposed in a CZ furnace (herein after often called a "furnace cooler") for cooling a pulled single crystal has recently been employed. Use of such a CZ single crystal puller equipped with a furnace cooler enables a considerable increase in a single-crystal pull rate. Consequently, efficiency in production of a single crystal ingot or wafer can be increased. Hence, the CZ single crystal puller equipped with a furnace cooler is of great significance.

Studies conducted by the present inventors showed that presence of a cooler poses difficulty in eliminating dislocations from a silicon seed crystal when an attempt is made to eliminate dislocations (primarily dislocations induced by thermal shock when a seed crystal is immersed in a melt) from a silicon seed crystal through use of the Dash's neck method (W. Dash: Journal of Applied Physics 30 (1959) pg. 459).

The present invention has been conceived in light of the foregoing drawbacks, and a first object of the present invention is to provide a CZ single crystal puller which is equipped with a cooler to be disposed in a CZ furnace and which can smoothly eliminate dislocations from a silicon seed crystal by means of the Dash's neck method.

In addition to the furnace cooler, a thermal insulation shield or a like member for shielding heat radiating from a heater or a melt is often disposed within the CZ furnace in order to optimize requirements for pulling a single crystal.

At the time of pulling of a single crystal through use of the CZ method, material is additionally charged or recharged in order to produce a single crystal of maximum size during a single process.

However, members to be disposed within a furnace (hereinafter often called "furnace members"); particularly, the cooler and the thermal insulation shield, hinder additional charge or recharge of material. Great attention must be paid to a problem of melt splashes; particularly, during additional charge or recharge of material, rather than during initial charge of material. When a cooler is disposed near a crucible, heating must be effected so as to overcome the cooling effect of the cooler at the time of charge of material. Hence, the amount of energy dissipation is increased.

The present invention has been conceived in view of the above-described drawbacks, and a second object of the present invention is to provide a CZ single crystal puller which is equipped with a cooler and a thermal-insulation shield, both being provided in a CZ furnace, and which can smoothly perform additional charge or recharge of material.

In connection with a CZ single crystal puller which pulls a single crystal by means of the Czochralski (CZ) method, there have already been put forward various types of coolers to be disposed in a CZ furnace of the CZ single crystal puller. One of the proposed coolers moves within the CZ furnace (as described in Japanese Patent Application Laid-Open No. 92272/1999). There is room for improving such a furnace cooler.

The present invention has been conceived in view of the drawback set forth, and a third object of the present invention is to provide a CZ single crystal puller having a cooler which is to be disposed in a CZ furnace and has improved functionality.

A fourth object of the present invention is to provide a CZ single crystal puller which has a cooler moving within a CZ furnace and a safety mechanist, wherein the cooler located within the CZ furnace immediately avoids hazards by means of appropriately detecting potential collision with other furnace members.

In connection with a silicon wafer produced by means of the CZ method for use in manufacturing semiconductor devices, crystalline imperfections which deteriorate the quality of a device are present in the surface layer of a silicon wafer that is simply sliced off from a silicon ingot. As the silicon wafer is subjected to intense heat treatment (i.e., annealing), voids existing in the surface layer of a wafer disappear. For example, it has been known that voids—which are detected as, for example, LSTDs, FPDs, or COPs, and exist in the surface layer of a CZ silicon wafer having been subjected to hydrogen heat treatment (hydrogen annealing)—disappear and as a result the wafer exhibits a superior oxide film withstand-pressure characteristic (as described in Japanese Patent Publication No. 80338/1991).

However, the effect of hydrogen annealing is limited to solely the area in the vicinity of the uppermost surface of a silicon wafer. In this regard, the present inventors found that the rate at or depth to which defects located in the vicinity of the surface layer of a wafer are eliminated by means of high-temperature annealing substantially depends on the sizes of initial defects. The present inventors have proposed a method of expanding a defect-free area from the surface layer of a wafer to a comparatively deep position in the wafer, by means of increasing a cooling rate of crystal being grown within a temperature zone in which defects are apt to arise (as described in Japanese Patent Application Laid-Open No. 208987/1998), controlling a V/G (V denotes a pull rate, and G denotes a temperature gradient along the crystallographic axis and in the vicinity of a melting point), or controlling the diameter of an OSF ring (as described in Japanese Patent Application Laid-Open No. 154095/2000), thus miniaturizing size of defects in a crystal.

So long as a rate at which a crystal is to be pulled (hereinafter called simply a "crystal pull rate") is increased, the method enables miniaturization of defects of a growing crystal to a size at which the defects are apt to disappear by means of annealing. Further, if the pull rate is increased, the volume of silicon ingot produced per unit time is eventually increased, thus improving the production efficiency of a wafer.

If a crystal can be pulled faster than what has been expected thus far, the production efficiency of wafers of all types can be improved to a much greater extent, regardless of whether the wafer is to be used for epitaxial growth or annealing purpose.

In a case where a crystal pull rate is increased, if miniaturization of crystalline imperfections becomes possible at least without a crystal being adversely affected by an increase in pull rate, crystalline imperfections can be miniaturized at a high pull rate. Particularly, if an increase in pull rate and miniaturization of crystalline imperfections can be attained simultaneously, immediate production of a wafer for annealing purpose (i.e., from which crystalline imperfections are likely to disappear and which is suitable for undergoing annealing) can be attained.

The present invention has been conceived in view of the drawbacks of the related art set forth, and a fifth object of the present invention is to improve production efficiency of wafers of all types, regardless of whether or not the wafers are to be used for epitaxial growth or annealing purpose, by means of increasing the crystal pull rate.

A sixth object of the present invention is to simultaneous realization of miniaturization of crystalline imperfections to a size smaller than has been expected thus far and an increased pull rate, thereby improving the production efficiency of a wafer for annealing purpose.

SUMMARY OF THE INVENTION

To achieve the first object, the present invention provides a Czochralski (CZ) single crystal puller, in which a cooler is moved away from a melt surface during the course of elimination of dislocations from a silicon seed crystal using the Dash's neck method.

The studies conducted by the present inventors show that, when a thermal insulation member is disposed at a position above a melt surface and a cooling coil is disposed at a position much higher than the location of the thermal insulation member, dislocations can be eliminated only under specific conditions to which the Dash's neck method is applied. The studies have greatly contributed to completion of the present invention.

A technique analogous to the present invention is described in Japanese Patent Application Laid-Open No. 189488/1999. The application states that elimination of dislocations can be achieved without involvement of a necking process, by means of setting the distance between a melt surface and the lower end of the thermal insulation member to a predetermined range, and reducing the temperature difference between a melt and a seed crystal before immersion into the melt. However, if a cooler is located in the vicinity of a seed crystal, elimination of dislocations is impossible. Examples of inventions in which cooling means is placed at a position higher than a melt for cooling crystal are described in Japanese Patent Application Laid-Open Nos. 317491/1992 and 239291/1996. However, elimination of dislocations after a seed crystal has been immersed in melt is not described at all.

More specifically, in order to achieve the first object, the present invention provides:

(A1) A method of enabling adjustment for eliminating defects by use of the Dash's neck method, by means of arranging a cooler for cooling a pulled single crystal provided in a Czochralski (CZ) single crystal puller so as to be able to move within a CZ furnace.

(A2) A method of enhancing the efficiency of eliminating dislocation by use of the Dash's neck method, by means of moving away from a silicon melt surface a cooler which cools a pulled single crystal and is disposed in a CZ silicon single crystal puller so as to be movable within a CZ furnace, during the course of drawing of a seed by use of the Dash's neck method.

(A3) The method as defined in (A2) is characterized in that a thermal insulation member is moved away from a silicon melt surface along with the cooler.

In the present invention, during the course of drawing of a seed by use of the Dash's neck method, a cooler and a thermal insulation member are basically spaced apart from the surface of a silicon melt. The locations to which the cooler and the thermal insulation member are retracted are locations where the cooler or the thermal insulation member do not adversely affect elimination of dislocations. Most preferably, the locations belong to a "dislocation-elimination range" (as will be described by reference to the accompanying drawings in a subsequent embodiment, the range can be taken as a given range mapped by the distance between the melt surface and the lower end of the cooler and by the distance between the melt surface and the lower end of the thermal insulation member). When the cooler and the thermal insulation member are situated in the range, there is yielded the same effect as that yielded when the cooler and the thermal insulation member are not provided in the CZ furnace (i.e., the effect of eliminating dislocations by virtue of the Dash's neck method).

(A4) A method of removing a cooler for cooling a pulled single crystal which is disposed in a CZ silicon single crystal puller, for the purpose of enhancing the efficiency of elimination of dislocations by use of the Dash's neck method.

(A5) A Czochralski (CZ) single crystal puller having a cooler for cooling a pulled single crystal, and a hoisting-and-lowering apparatus for hoisting or lowering the cooler within a CZ furnace, wherein the hoisting-and-lowering apparatus hoists the cooler to a higher position during the course of drawing of a seed according to the Dash's neck method.

(A6) A Czochralski (CZ) single crystal puller having a cooler for cooling a pulled single crystal, a hoisting-and-lowering apparatus for hoisting or lowering the cooler within a CZ furnace, and a thermal insulation member which surrounds a single crystal and is disposed in the CZ furnace in a portable manner, wherein the hoisting-and-lowering apparatus hoists the cooler and the thermal insulation member to higher positions during the course of drawing of a seed according to the Dash's neck method.

(A7) The CZ single crystal puller as defined (A6) is characterized in that the cooler is provided with an engagement member and the thermal insulation member is provided with another engagement member and that, when the cooler is hoisted, the engagement members are engaged with each other, and the thermal insulation member is lifted in association with upward movement of the cooler.

(A8) A Czochralski (CZ) single crystal puller having a crucible which is freely movable in the vertical direction and stores silicon melt and a cooler for cooling a pulled single crystal, wherein a seed is drawn by use of the Dash's neck method while the crucible is lowered and the cooler is moved away from the surface of the silicon melt.

(A9) A Czochralski (CZ) single crystal puller having a crucible which is freely movable in the vertical direction and stores silicon melt, a cooler for cooling a pulled single crystal, and a thermal insulation member for surrounding a silicon single crystal pulled from the silicon melt, wherein a seed is drawn by use of the Dash's neck method while the crucible is lowered and while the cooler and the bottom surface of the thermal insulation member are moved away from the surface of the silicon melt.

(A10) A silicon ingot produced by the CZ single crystal puller as defined in any one of (A5) to (A9).

(A11) A silicon wafer sliced off from the silicon ingot defined in (A10).

When a wafer is sliced off from a silicon ingot, a wafer is usually sliced off from an area on the silicon ingot to be used for producing products. In contrast, when a wafer is sliced for research purpose or as a dummy, there may be a case where a wafer is sliced off from a shoulder or tail portion of the silicon ingot.

To achieve the second object, the present invention provides a Czochralski (CZ) single crystal puller, wherein a cooler and a thermal insulation member are immediately moved upward away from a melt surface at the time of additional charge or recharge of material.

More specifically, in order to achieve the second object, the present invention provides:

(B1) A method of promoting smooth recharge or additional charge of material, by means of arranging a crucible for melting charged material and a cooler for cooling a pulled single crystal disposed in a Czochralski (CZ) single crystal puller such that the crucible and the cooler are movable within a CZ furnace.

(B2) A Czochralski (CZ) single crystal puller for recharge or additional charge purpose, comprising:

a crucible for melting charged material;

a cooler for cooling a pulled single crystal; and a hoisting-and-lowering apparatus for hoisting or lowering the cooler within a CZ furnace.

(B3) A Czochralski (CZ) single crystal puller for recharge or additional charge purpose, comprising:

a crucible for melting charged material;

a cooler for cooling a pulled single crystal; and a hoisting-and-lowering apparatus for hoisting or lowering the cooler within a CZ furnace, wherein the hoisting-and-lowering apparatus hoists the cooler so as to move away from material when material is charged.

(B4) The CZ single crystal puller as defined in (B3) further comprises a thermal insulation member which surrounds a single crystal and is disposed in the CZ furnace in a portable manner, wherein the cooler is provided with an engagement member, and the thermal insulation member is provided with another engagement member; and wherein, when the cooler is hoisted, the engagement members are engaged with each other, and the thermal insulation member is lifted in association with upward movement of the cooler.

The expression "portable state" means that setting are made such that the thermal insulation member is freely removable and can be moved within the furnace.

(B5) The CZ single crystal puller as defined in (B3) or (B4) is characterized in that a CZ single crystal puller is used for recharging or additional charging purpose.

(B6) The CZ single crystal puller as defined in any one of (B2) through (B5) is characterized in that the cooler is a water-cooling type cooler including a cooling pipe stack which helically surrounds a single crystal and that the engagement member provided in the cooler is a plate member with an engagement section to be inserted into a space between the cooling pipe stack of the cooler.

(B7) The CZ single crystal puller as defined in (B2), (B5), or (B6) is characterized in that a heater for heating the crucible is equipped with a side heater disposed at the side of the crucible and a bottom heater disposed below the crucible.

(B8) The CZ single crystal puller as defined in (B7) is characterized in that the output of the side heater or the output of the bottom heater or both are adjusted in accordance with the amount of melt, as required.

In the CZ single crystal puller according to the present invention, an output of at least one of the side heater and the bottom heater is adjusted, as required, in accordance with the level of melt. Particularly, when a melt is diminished, there can be avoided a problem of an increase in the amount of heat applied to the crucible in order to overcome a cooling effect of the cooler.

As a matter of course, a magnetic field can be applied to the crucible while a side heater and a bottom heater are turned on. Further, application of a magnetic field may or may not be effected while only the bottom heater is turned on. As means for applying a magnetic field to a material melt in the crucible, there can be employed means such as that described in, for example, Japanese Patent Application Laid-Open No. 45889/1981. Further, as means for generating a cusp magnetic field, there can be employed means such as that described in Japanese Patent Application Laid-Open No. 217493/1983.

(B9) A method of curtailing costs for producing a wafer, by use of a CZ single crystal puller for recharge or additional charge purpose defined in (B2), (B5), or (B8).

(B10) A silicon ingot produced by a CZ single crystal puller for recharge or additional charge purpose defined in (B2), (B5), or (B8).

(B11) A silicon wafer sliced off from the silicon ingot defined in (B10).

A silicon ingot manufactured by a CZ single crystal puller for recharge purpose or a CZ single crystal puller for additional charge purpose according to the present invention is longer than that produced by an ordinary CZ single crystal puller, by the amount corresponding to that produced as a result of recharge or additional charge operation. Further, the CZ single crystal puller according to the present invention employs a cooler and enables high-speed pulling of crystal. Hence, the CZ single crystal puller according to the present invention can produce a silicon ingot longer than that produced by the ordinary CZ single crystal puller during the same period of time in which a silicon ingot is produced by the ordinary CZ single crystal puller. For this reason, manufacturing costs can be reduced from those incurred when a silicon ingot is produced by an ordinary CZ silicon crystal puller. Thus, there can be provided a less-expensive silicon ingot or less-expensive silicon wafers.

In a sense, when a less-expensive silicon ingot or a less-expensive silicon water is provided (particularly when the price of a silicon ingot or wafer is far cheaper and cannot be achieved by application of the conventional technology), it can be suggested that the silicon ingot or wafer was produced by means of the CZ single crystal puller for recharge purpose of the CZ single crystal puller for additional purpose according to the present invention. Hence, infringement of the right of the present invention can be suggested.

When a wafer is sliced off from a silicon ingot, a wafer is usually sliced off from an area on the silicon ingot to be used for producing products. In contrast, when a wafer is sliced for research purpose or as a dummy, there may be a case where a wafer is sliced off from a shoulder or tail portion of the silicon ingot.

The silicon wafer production method and CZ single crystal puller according to the present invention are not affected by the type of a single crystal ingot to be pulled. It is thought that the method and puller can be applied to a general CZ method. Hence, a single crystal ingot to be pulled is not limited to a silicon single crystal ingot.

To achieve the third object of the present invention, immediate operation for avoiding hazard is ensured by means of changing the travel speed of the cooler, as required. The travel direction of the cooler is not limited to the vertical direction. Directional variations are added, such as movement in an inclined direction or rotation, whereby a cooler is hoisted so as not to hinder movement or visual recognition of other furnace members.

More specifically, in order to achieve the third object, the present invention provides:

(C1) A Czochralski (CZ) single crystal puller for pulling a single crystal from a melt, having a crucible for storing melt, a crucible hoisting-and-lowering apparatus for hoisting or lowering the crucible, a thermal insulation member for surrounding a pulled single crystal, a heater for supplying heat to the crucible, a cooler for cooling the pulled single crystal, and a cooler movement apparatus for moving the cooler, wherein the cooler movement apparatus changes a travel speed of the cooler in two or more steps.

Preferably, the cooler movement apparatus is a cooler hoisting-and-lowering apparatus for moving the cooler vertically.

(C2) A Czochralski (CZ) single crystal puller for pulling a single crystal from a melt, having a crucible for storing melt; a crucible hoisting-and-lowering apparatus for hoisting or lowering the crucible; a thermal insulation member for surrounding a pulled single crystal; a heater for supplying heat to the crucible; a cooler for cooling the pulled single crystal; a chamber for storing the crucible, the crucible hoisting-and-lowering apparatus, the thermal insulation member, the heater, and the cooler; and a cooler movement apparatus for moving the cooler, wherein the cooler includes a cooling pipe stack which surrounds a pulled single crystal, and a supply-and-exhaust pipe which passes through the chamber and supplies cooling water to the cooling pipe stack, and the cooler movement apparatus includes a bridging member connected to the supply-and-exhaust pipe, a screw-threaded shaft screwed to the bridging member, and a drive member for rotating the screw-threaded shaft.

(C3) The CZ single crystal puller as defined in (C2) further comprises an expansion-and-contraction member which covers an area in the chamber through which the supply-and-exhaust pipe of the chamber passes such that a hermetic state in the chamber is maintained, and expands or contracts in accordance with vertical movement of the supply-and-exhaust pipe.

(C4) The CZ single crystal puller as defined in (C3) is characterized in that the cooler hoisting-and-lowering apparatus moves the cooler in the vertical direction.

(C5) The CZ single crystal puller as defined in (C3) is characterized in that the cooler hoisting-and-lowering apparatus moves the cooler in an inclined direction.

(C6) The CZ single crystal puller as defined in (C5) is characterized in that a plurality of pieces of cooler hoisting-and-lowering apparatus are provided in the chamber and that the cooling pipe stack of the cooler is separated into separated into segments which are to be integrated so as to constitute a cylindrical shape and is equal in number to the cooler hoisting-and-lowering apparatus.

(C7) The CZ single crystal puller as defined in (C4) or (C5) further comprises an encoder for tracing a distance over which the cooler is vertically moved.

(C8) The CZ single crystal puller as defined in any one of (C2) through (C7) further comprises a limiter member for hindering lower movement of the bridging member from a predetermined position of the screw-threaded shaft.

The simplest limiter member is a solid member such as a metal block. Such a solid member may be formed from a limiter switch (LS). The bridging member may be returned upward immediately after contact on the limiter member has been detected.

(C9) The CZ single crystal puller as defined in any one of (C2) through (C8), the cooler hoisting-and-lowering apparatus changes the speed of vertical movement of the cooler in two steps or more.

The CZ single crystal puller according to the present invention can be provided with magnetic field application means for applying a magnetic field to a melt of material stored in a crucible. As means for applying a magnetic field to a material melt in the crucible, there can be employed means such as that described in, for example, Japanese Patent Application Laid-Open No. 45889/1981. Further, as means for generating a cusp magnetic field, there can be applied means such as that described in Japanese Patent Application Laid-Open No. 217493/1983.

The silicon wafer production method and CZ single crystal puller according to the present invention are not affected by the type of a single crystal ingot to be pulled. It is thought that the method and puller can be applied to a general CZ method. Hence, a single crystal ingot to be pulled is not limited to a silicon single crystal ingot.

In order to achieve the fourth object, the present invention provides, as an example, a CZ single crystal puller, in which a touch sensor is formed between a cooler and another member, and collision between the cooler and another member is immediately and accurately detected. On the basis of the result of detection, the cooler is retracted immediately from a dangerous location.

More specifically, in order to achieve the fourth object, the present invention provides:

(D1) A method of enhancing maintainability of a Czochralski (CZ) single crystal puller, by means of arranging a cooler for cooling a pulled single crystal provided in the CZ single crystal puller so as to be able to move within a CZ furnace.

Here, the expression "movement" is abroad concept covering ascending action and descending action. The expression implies curved motion, such as rotational movement, as well as linear motion in the longitudinal, lateral, and slant directions.

(D2) A method of enhancing maintainability of a Czochralski (CZ) single crystal puller equipped with a cooler which can be hoisted and lowered within a CZ furnace and cools a pulled single crystal, wherein, in the event that anomalies have arisen in the CZ single crystal puller, the cooler is retracted from a location where the anomalies have arisen.

It is though that, in most cases, retraction of a cooler from a location where anomalies have arisen is embodied by moving the cooler away from a melt surface or moving the cooler away from a pulled single crystal.

(D3) A method of enhancing maintain ability of a Czochralski (CZ) single crystal puller equipped with a cooler which can be hoisted and lowered within a CZ furnace and cools a pulled single crystal, wherein, in the event that anomalies have arisen in the CZ single crystal puller for reasons of vertical movement of the cooler, the cooler is temporarily moved in the reverse direction.

The expression "temporarily moving the cooler in the reverse direction" means that, if the cooler is in the course of lowering action, the cooler is lifted slightly. In contrast, if the cooler is in the course of ascending action, the cooler is lowered slightly. In the CZ single crystal puller according to the present invention, the upward movement or downward movement of the cooler in this case falls within a range of about 5 mm.

(D4) A method of enhancing maintainability of a Czochralski (CZ) single crystal puller equipped with a cooler which can be hoisted and lowered within a CZ furnace and cools a pulled single crystal, wherein the speed of vertical movement of the cooler is made variable; and wherein, in the event that anomalies have arisen in the CZ single crystal puller, the cooler is retracted from a location where the anomalies have arisen.

(D5) A method of enhancing maintainability of a Czochralski (CZ) single crystal puller equipped with a cooler which can be hoisted and lowered within a CZ furnace and cools a pulled single crystal, wherein the speed of vertical movement of the cooler is made variable; and wherein, in the event that anomalies have arisen in the CZ single crystal puller for reasons of vertical movement of the cooler, the cooler is switched to a high-speed mode and is retracted from a location where the anomalies have arisen.

(D6) The method as defined in any one of (D1) through (D5) is characterized in that the cooler is of water-cooling type.

(D7) A Czochralski (CZ) single crystal puller having a cooler for cooling a pulled single crystal and a hoisting-and-lowering apparatus for hoisting or lowering the cooler within a CZ furnace, wherein, in the event that anomalies have arisen in the CZ single crystal puller, the hoisting-and-lowering apparatus hoists the cooler so as to move away from a melt surface.

(D8) The CZ single crystal puller as defined in (D7) is characterized in that the hoisting-and-lowering apparatus variably changes the hoisting or lowering speed of the cooler, and, in the event that anomalies have arisen, the hoisting-and-lowering apparatus is switched to a higher speed and moves the cooler away from a melt surface.

(D9) The CZ single crystal puller as defined in (D7) or (D8) further comprises a thermograph for sensing the distribution of internal temperature of the CZ furnace or a temperature sensor for sensing the temperature of the surface of the cooler, wherein, when an anomalous rise in the surface temperature of the cooler is sensed, the cooler is moved away from a pulled single crystal and material melt.

The "temperature sensor" is essentially provided on the side of the cooler facing a pulled single crystal (i.e., on the interior side of the cooler). However, if the temperature sensor is provided on the exterior side of the cooler, overheating of the thermal insulation member by the heater disposed outside (i.e., the heater for heating the crucible) can also be sensed.

(D10) A Czochralski (CZ) single crystal puller having a cooler for cooling a pulled single crystal and a hoisting-and-lowering apparatus for hoisting or lowering the cooler within a CZ furnace, wherein, in the event that near miss or collision between the cooler and another furnace member during the lowering of the cooler is detected, the hoisting-and-lowering apparatus hoists the cooler.

(D11) The Czochralski (CZ) single crystal puller as defined in (D10) is characterized in that the hoisting-and-lowering apparatus vertically moves the cooler at a variable speed and that, in the event that near miss or collision has arisen, the hoisting-and-lowering apparatus is switched to a high speed and hoists the cooler.

(D12) A Czochralski (CZ) single crystal puller having a cooler for cooling a pulled single crystal, a hoisting-and-lowering apparatus for hoisting or lowering the cooler within a CZ furnace, and a range sensor for sensing the positional relationship between members, wherein, in the event that near miss or collision between the cooler and pulled single crystal or material melt or between other furnace members is detected by the range sensor, the cooler is retracted from a location where the near miss or collision has been detected.

Near miss or collision between a cooler and melt of material can be detected through use of a so-called melt level sensor (described in, e.g., Japanese Patent Application Laid-Open No. 264779/2000). Further, near miss or collision between a cooler and a pulled single crystal becomes possible when the "range sensor" is a two-dimensional sensor. The melt level sensor described in the previously-described Japanese Patent Application Laid-Open No. 264779/2000 also has a two-dimensional sensor function. Hence, the melt level sensor is suitable as a sensor to be attached to the CZ single crystal puller according to the present invention. Here, the two-dimensional sensor includes an embodiment in which the horizontal positional relationship is detected by means of a CCD camera.

(D13) A Czochralski (CZ) single crystal puller having a cooler for cooling a pulled single crystal and a hoisting-and-lowering apparatus for hoisting or lowering the cooler within a CZ furnace, wherein a touch sensor is constituted as a whole between the cooler and pulled single crystal or material melt or between other furnace members is detected by the range sensor; and wherein, when the touch sensor has sensed contact, the cooler is retracted from a location where the contact has been sensed.

Here, the expression "constitutes a touch sensor" means that a cooler is insulated from a pulled single crystal; for example, a feeble current is applied to the cooler and crystal while an ammeter is connected to the cooler. Alternatively, a melt of material is insulated from other furnace members, and a feeble current is applied to them while an ammeter is connected to the furnace members.

(D14) A Czochralski (CZ) single crystal puller having a cooler for cooling a pulled single crystal and a hoisting-and-lowering apparatus for hoisting or lowering the cooler within a CZ furnace, wherein, in the event that overload has arisen during the course of vertical movement of the cooler, the hoisting-and-lowering apparatus moves the cooler in the direction opposite to that in which the overload is to arise, thereby retracting the cooler away from the location where the overload has arisen.

(D15) A Czochralski (CZ) single crystal puller having a cooler for cooling a pulled single crystal and a hoisting-and-lowering apparatus for hoisting or lowering the cooler within a CZ furnace, wherein, in the event that anomalous changes have arisen in the weight of a single crystal during the course of pulling of the single crystal, the cooler is retracted away from the single crystal.

The mechanism described in (D12) through (D15) can be incorporated into the puller described in (D10) or (D11).

(D16) The CZ single crystal puller as defined in any one of (D15) through (D17) is characterized in that the cooler is of water-cooling type.

(D17) The CZ single crystal puller as defined in (D16) further comprises a steam sensor for sensing steam originating from the CZ furnace, wherein, in the event that the steam sensor detects steam, the cooler is moved away from a pulled single crystal or material melt.

(D18) The CZ single crystal puller as defined in (D16) further comprises a thermometer for sensing the temperature of cooling water which has circulated through the cooler, wherein, in the event that an anomalous arise in the temperature of the cooling water has been detected, the cooler is moved away from a pulled single crystal or material melt.

(D19) A Czochralski (CZ) single crystal puller having a cooler for cooling a pulled single crystal, a hoisting-and-lowering apparatus for hoisting or lowering the cooler within a CZ furnace, and an encoder for tracing a distance over which the cooler has been vertically moved, wherein, in the event that near miss or collision between the cooler and material melt or between other furnace members is detected on the basis of a value computed through use of information output from the encoder, the cooler is retracted from a location where the near miss or collision is detected.

In order to achieve the fifth object, the present inventors have pinned down a combination of factors which do not mutually act in a negative manner (and which preferably a combination of factors which act in a positive manner). By means of such a combination, the crystal pull rate is increased to a speed greater than that expected thus far. As a result, production efficiency of wafers of all types is improved without regard to whether wafers are for annealing purpose or epitaxial purpose.

In order to achieve the sixth object, the present inventors have pinned down a combination of factors which enable miniaturization of crystalline imperfections and an increase in pull rate, as in the case where the fifth object has been achieved. By means of such a combination, the crystal pull rate is increased to a speed greater than that expected thus far. As a result, production efficiency of wafers for annealing purpose is improved.

Control of sizes of crystalline imperfections during the course of manufacture of a single crystal by use of the CZ method is delicate, because subtle elements are intertwined with each other. There is no guarantee that the common knowledge obtained without use of a cooler applies directly to a situation in which a cooler is used. Against this backdrop, the present inventors have found that the effect of miniaturizing crystalline imperfections yielded by nitrogen doping is sustained even when a cooler is used. This finding has made a great contribution to completion of the present invention.

In a different manner, in order to solve conventional problems relating to an increase in crystal pull rate, the present invention has provided a group of factors [i.e., an aggregation (or palette) of factors] which pertain to an increase in crystal pull rate and miniaturization of crystalline imperfections and do not involve interference or neutralization. One or two or more factors are selected from the group, and an additive effect, more preferably a synergistic effect, is yielded with regard to an increase in crystal pull rate or miniaturization of crystalline imperfections.

To achieve the fifth and sixth objects, the present invention provides:

(E1) A method of pulling a silicon single crystal by use of a Czochralski (CZ) method, wherein a rate at which a silicon single crystal is to be pulled by use of the CZ method is increased by means of selecting one or more factors from the group comprising adjustment of a hot zone, disposition and adjustment of a thermal shield member, adjustment of a distance between the bottom of the thermal shield member and a melt surface, disposition and adjustment of a cooler, and application and adjustment of a magnetic field.

(E2) A method of pulling a silicon single crystal by use of a Czochralski (CZ) method, wherein crystal imperfections arising in a silicon single crystal to be pulled using the CZ method are reduced, by means of selecting one or more factors from the group comprising adjustment of a hot zone, disposition and adjustment of a thermal shield member, adjustment of a distance between the bottom of the thermal shield member and a melt surface, disposition and adjustment of a cooler, application and adjustment of a magnetic field, and adjustment of doping level of nitrogen.

(E3) A method of pulling a silicon single crystal by use of a Czochralski (CZ) method, wherein speeding up of a rate at which a silicon single crystal is to be pulled according to a CZ method and miniaturization of crystal imperfections are achieved simultaneously, by means of disposing and adjusting a cooler, as well as selecting one or more factors from the group comprising application and adjustment of a magnetic field, adjustment of a hot zone, disposition and adjustment of a thermal shield member, adjustment of a distance between the bottom of the thermal shield member and a melt surface, disposition and adjustment of a thermal insulation member, adjustment of a distance between the bottom of the thermal insulation member and a melt surface, and adjustment of doping level of nitrogen (E4) A silicon ingot for high-speed production of wafers which is produced according to the method as defined in any one of (E1) through (E3) and miniaturizes crystalline imperfections.

(E5) A wafer for epitaxial growth or annealing purpose which is sliced off from the silicon ingot described in (E4).

(E6) A method of optimizing a rate at which a silicon single crystal is to be pulled according to the CZ method, by means of selecting one or more factors from the group comprising adjustment of a hot zone, disposition and adjustment of a thermal shield member, adjustment of a distance between the bottom of the thermal shield member and a melt surface, disposition and adjustment of a cooler, application and adjustment of a magnetic field, and adjustment of doping level of nitrogen.

(E7) A computer-readable storage medium having stored thereon two or more data sets which are selected from the group comprising adjustment of a hot zone, disposition and adjustment of a thermal shield member, adjustment of a distance between the bottom of the thermal shield member and a melt surface, disposition and adjustment of a cooler, and application and adjustment of a magnetic field, at the time of pulling a silicon single crystal by use of a Czochralski (CZ) method.

(E8) A computer-readable storage medium having stored thereon two or more data sets which are selected from the group comprising adjustment of a hot zone, disposition and adjustment of a thermal shield member, adjustment of a distance between the bottom of the thermal shield member and a melt surface, disposition and adjustment of a cooler, application and adjustment of a magnetic field, and adjustment of doping level of nitrogen, at the time of pulling a silicon single crystal by use of a Czochralski (CZ) method.

(E9) A computer-readable storage medium having stored thereon two or more data sets which are selected, along with data for disposing and adjusting a cooler, from the group comprising adjustment of a hot zone, disposition and adjustment of a thermal shield member, adjustment of a distance between the bottom of the thermal shield member and a melt surface, disposition and adjustment of a cooler, application and adjustment of a magnetic field, and adjustment of doping level of nitrogen, at the time of pulling a silicon single crystal by use of a Czochralski (CZ) method.

(E10) A program for increasing a rate at which a silicon single crystal is to be pulled according to the CZ method, wherein a computer-readable storage medium has stored thereon one or more programs which are selected from the group comprising adjustment of a hot zone, disposition and adjustment of a thermal shield member, adjustment of a distance between the bottom of the thermal shield member and a melt surface, adjustment of a cooler, and application and adjustment of a magnetic field.

(E11) A program for miniaturizing crystalline imperfections arising in a silicon single crystal is to be pulled according to the CZ method, wherein a computer-readable storage medium has stored thereon one or more programs which are selected from the group comprising adjustment of a hot zone, disposition and adjustment of a thermal shield member, adjustment of a distance between the bottom of the thermal shield member and a melt surface, adjustment of a cooler, application and adjustment of a magnetic field, and adjustment of doping level of nitrogen.

(E12) A program for increasing a rate at which a silicon single crystal is to be pulled according to the CZ method and for miniaturizing crystalline imperfections, wherein a computer-readable storage medium has stored thereon one or more programs which are selected, along with data for disposing and adjusting a cooler, from the group comprising adjustment of a hot zone, disposition and adjustment of a thermal shield member, adjustment of a distance between the bottom of the thermal shield member and a melt surface, and adjustment of doping level of nitrogen.

(E13) A silicon single crystal puller having stored therein the storage medium defined in any one of (E7) through (E9) and/or the storage medium as defined in any one of (E10) through (E12).

[Definition of Terms]

In the specification, the expression "furnace members" means material objects which are present within a CZ furnace. The furnace members comprehensively include a cooler, a thermal insulation member, a single crystal, a crucible, the interior wall surface of the CZ furnace, etc.

The expression "maintainability" is a broad concept including the ease of maintenance or safety.

The expression "occurrence of anomalies" implies, for example, detection of anomalies caused by operators, power failures, failures of a vacuum pump, failures of power supply for a heater, damage to furnace members, failures of a cooling-water pump, etc.

The expression "anomalous changes in the weight of pulled single crystal" means that a weight change of greater than ordinary permissible magnitude has arisen in a single crystal being pulled. Such a change is detected by the load imposed on a motor which pulls the single crystal. The expression "anomalous rise in the temperature of cooling water" means that a temperature change of greater than ordinary permissible magnitude has arisen in the cooling water circulating through the cooler. Here, a thermometer to be provided in the cooler may be embodied in any form.

The CZ single crystal puller according to the present invention can be provided with magnetic field application means for applying a magnetic field to a melt of material stored in a crucible. As means for applying a magnetic field to a material melt in the crucible, there can be employed means such as that described in, for example, Japanese Patent Application Laid-Open No. 45889/1981. Further, as means for generating a cusp magnetic field, there can be employed means such as that described in Japanese Patent Application Laid-Open No. 217493/1983.

The silicon wafer production method and CZ single crystal puller according to the present invention are not affected by the type of a single crystal ingot to be pulled; it is thought that they can be applied to a general CZ method. Hence, a single crystal ingot to be pulled is not limited to a silicon single crystal ingot.

The "temperature sensor" is formed from, e.g., a thermocouple. The "steam sensor" corresponds to an infrared-ray absorbency measurement sensor for detecting steam by means of changes in the absorbance of infrared rays. Further, the "infrared-ray absorbency measurement sensor" measures the amount of infrared rays absorbed or the ratio of absorption of infrared rays. Further, the "infrared-ray absorbency measurement sensor" is of reflection type or transmission type.

The "thermal insulation member" is to be disposed within a furnace of a CZ single crystal ingot production system for producing a single crystal ingot by use of the CZ method. The thermal insulation member is usually disposed so as to surround a single crystal ingot to be pulled from a melt, thus controlling the amount of heat radiated from a melt or a heater. The thermal insulation member regulates the flow of inactive gas supplied to the CZ furnace, as well as controlling the amount of heat radiated from melt or a heater. The thermal insulation member is also called a "gas flow sleeve."

The "hot zone" means an area in the CZ furnace which is directly or indirectly affected by the heating action of the heater. In some cases, the "hot zone" does not include a thermal insulation member. The expression "adjustment of a hot zone" means addition, modification, or deletion of a certain member, modification of material or type of a certain member, change of layout of members, addition, change, or deletion of moving state of a certain member, and change of energy status of the hot zone.

The expression "distance between the bottom of the thermal insulation member and the surface of a melt" can be measured by any means, so long as the means can appropriate measure a distance. For example, a melt level sensor described in Japanese Patent Application Laid-Open No. 264779/2000 is preferably used. In reality, the lower end of the thermal insulation member is changed during the course of pulling action, by means of thermal stress. Hence, preferably there is used a sensor, such as that described in Japanese Patent Application Laid-Open No. 264779/2000, which can accurately measure the distance between the lower end of the thermal insulation member and the melt surface.

Throughout the specification, the expression "single crystal" is a broad concept implying ingots, bulks, and wafers.

Throughout the specification, the expression "adjustment" is a broad concept implying changes of any status and change of any variable, such as adjustment of a positional relationship, a geometry, or intensity.

The expression "nitrogen doping" implies doping crystal with nitrogen during growth, by means of introduction of nitrogen gas during the course of growth of a crystal or doping silicon melt with nitrides. There has been put forward a method of applying the effect of miniaturizing defects by use of "nitrogen doping" to production of a wafer for annealing purpose (as described in Japanese Patent Application Laid-Open No. 98047/1998).

BRIEF DESCRIPTION OF THE DRAWINGS

FIGS. 4A and 4B are illustrations showing embodiments of cooling stacks for the cooler which moves in an inclined direction, wherein FIG. 4A is a side view and FIG. 4B is a top view;

FIGS. 8A through 8D are illustrations showing a jig to be used for a junction between an hoisting-and-lowering block and a supply-and-exhaust pipe of a cooler, and the construction of a closure for closing holes resulting from removal of the cooler, wherein FIG. 8A is a longitudinal cross-sectional view showing the jig, FIG. 8B is a longitudinal cross-sectional view showing the closure, FIG. 8C is a top view showing the jig, and FIG. 8D is an illustration for describing the construction of the jig;

FIG. 9A is an illustration for describing an additional charge process;

FIG. 9B is an illustration for describing a recharge process;

FIGS. 21A and 21B are graphs showing the relationship between cooling rate, defect density, and defect size when nitrogen is added to related-art requirements and when nitrogen is added to requirements for installing a cooler;

FIG. 23 shows mappings of typical LST surfaces and examples of defect density.

DETAILED DESCRIPTION OF THE PREFERRED EMBODIMENTS

Figure 1:
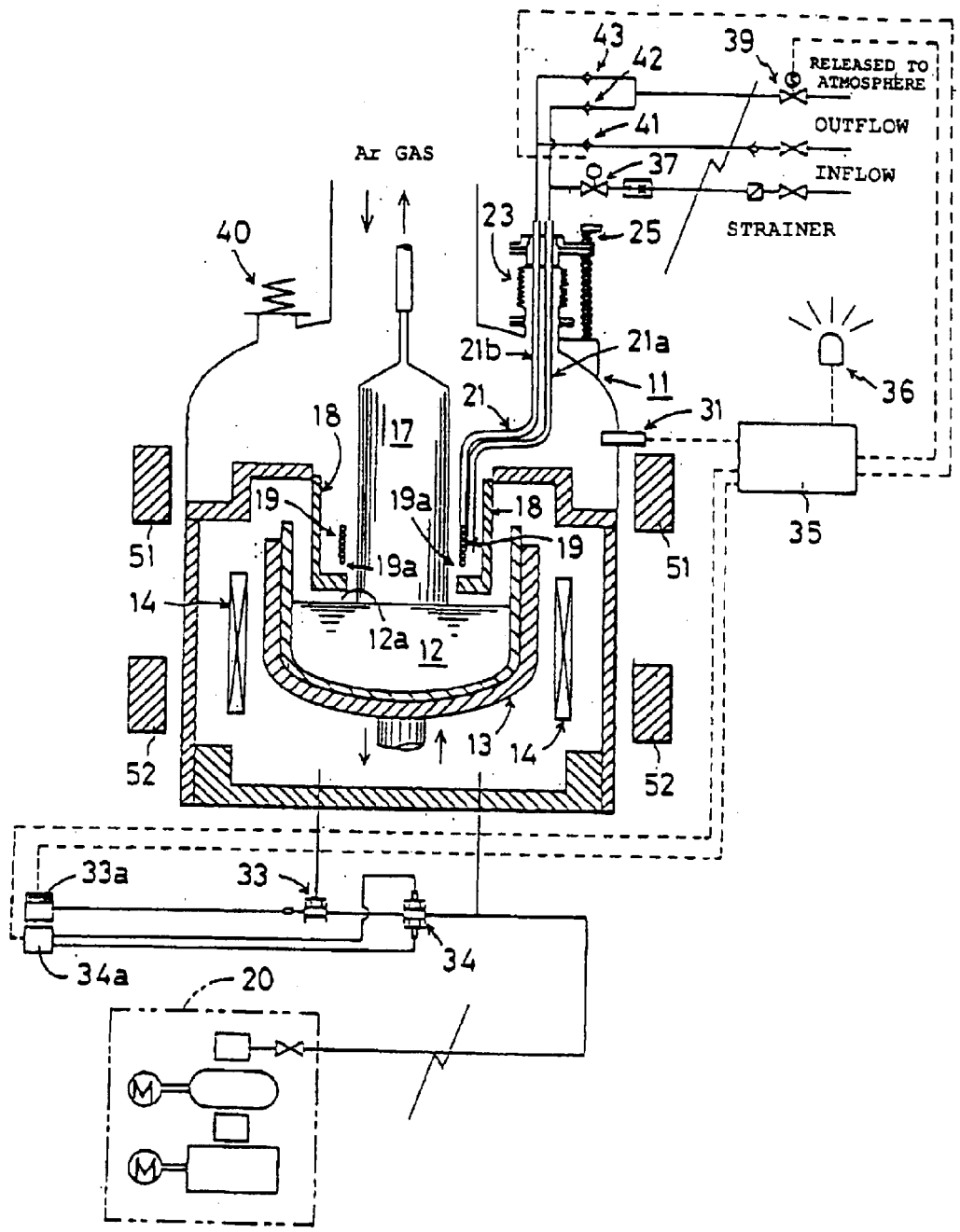
FIG. 1 is a block diagram showing a preferred embodiment of a CZ single crystal puller according to the present invention.

FIG. 1 is a block diagram showing a preferred embodiment of a CZ single crystal puller according to the present invention.

[Overall Construction of the Puller]

As in the case of an ordinary CZ single crystal puller, the CZ single crystal puller according to the present invention comprises a chamber 11 serving as a hermetic container; a crucible 13 which is provided in the chamber 11 and produces and stores a silicon melt 12; and heaters 14 disposed in the chamber 11 for heating the crucible 13. In addition to these elements, other elements, such as electrodes for supplying power to the heater 14, a crucible receiver for receiving the crucible 13, a pedestal for rotating the crucible 13, heat insulators, a melt receiver, and an inner cylinder, are provided in the CZ single crystal puller, as in the case of the ordinary CZ single crystal puller. Further, the CZ single crystal puller is provided with a thermal insulation member 18 for shielding a pulled single crystal 17 from the heat radiated from the silicon melt 12 and from the heater 14, and a cooler 19 disposed inside the thermal insulation member 18.

Such a CZ single crystal puller pulls a single crystal 17 while the pulled single crystal 17 is rotated in the direction opposite that in which the crucible 13 is rotated, as in the case of the ordinary CZ single crystal puller. The crucible 13 is moved up and down by means of an unillustrated lifter disposed beneath the crucible 13. Unless otherwise specified, the crucible 13 is moved vertically such that the crucible 13 ascends in accordance with descent of a silicon melt 12a stemming from pulling of a silicon single crystal ingot.

Although not illustrated, the CZ single crystal puller according to the present invention is provided with an inactive gas inlet/outlet system which is usually provided for a CZ single crystal puller of this type. In this system, the thermal insulation member 18 doubles as a member for regulating an inactive gas flow channel. Further, the CZ single crystal puller is connected to a vacuum pump 20 for exhausting gas from the chamber 11. Here, if the vacuum pump 20 is provided with means for detecting the opening of a throttle valve or the amount of electric power supplied to the pump 20, a pressure sensor to be described later can be omitted.

The CZ single crystal puller according to the present invention is equipped with solenoids 51 and 52 for imparting a cusp magnetic field to the silicon melt 12. The solenoids 51 and 52 impart a cusp magnetic field to the silicon melt 12, thereby eliminating minute convectional flows arising in the silicon melt 12. Thus, reduction of crystalline imperfections and stable pulling action can be promoted further.

Figure 2:
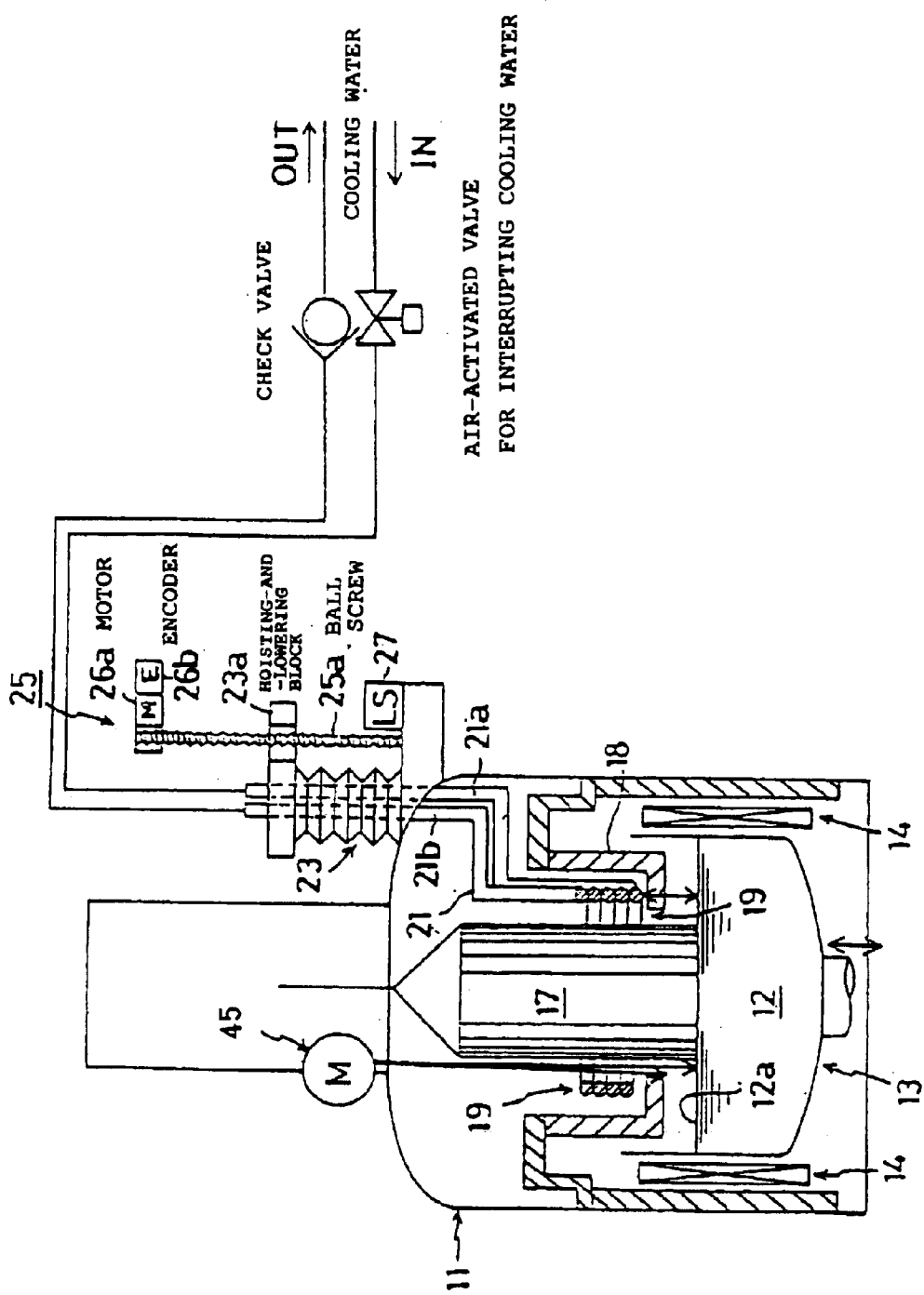
FIG. 2 is a block diagram for describing the functional construction of a hoisting and lowering apparatus of the CZ single crystal puller according to the present invention.

As shown in FIG. 2, the CZ single crystal puller according to the present invention is equipped with a melt level sensor 45 for sensing the distance between the surface 12a of the silicon melt 12 and the bottom surface of the thermal insulation member 18, or the distance between the surface 12a of the silicon melt 12 and the bottom of the cooler 19. The level of the surface 12a—which would change vertically in association with vertical movement of the crucible 13—an be sensed appropriately. By virtue of sensing of the level of the melt 12, the distance between the bottom surface of the thermal insulation member 18 and the surface 12a of the silicon melt 12 or the distance between the bottom of the cooler 19 and the surface 12a of the silicon melt 12 can be accurately controlled so as to match a distance at which elimination of crystalline imperfections can be achieved by the Dash's neck method to be described later.

[Cooler]

In the CZ single crystal puller according to the present invention, the cooler 19 is disposed within the thermal insulation member 18, wherein cooling water circulates through a pipe provided in the cooler 19. As shown in FIGS. 1 and 2, the cooler 19 is formed from a multilayer pipe surrounding the pulled single crystal 17 (i.e., a cooling pipe stack), and cooling water circulates through the pipe. The cooling water is supplied by way of a supply pipe 21a. A bellows member 23 is attached to the area on the chamber 11 from which a supply-and-exhaust pipe 21 (formed by combination of the supply pipe 21a and an exhaust pipe 21b) is inserted into the chamber 11, thus ensuring airtightness.

In the present embodiment, the pipe constituting the cooler 19 has an inner diameter of 17 mm or thereabouts. The speed at which cooling water circulates through the pipe is set to 15 liters/min. or less. If the inner diameter of the cooling pipe is reduced excessively, a sufficient cooling effect will not be obtained. However, if the inner diameter of the cooling pipe is reduced to a certain extent, the cooling effect will not be hindered much. In this case, the amount of water circulating through the cooler 19 is reduced. In the event of damage being inflicted on the cooler 19, water damage may be diminished accordingly.

The distance between the lower end 19a of the cooler 19 and the surface 12a of the silicon melt 12 is usually set to a value of 150 mm or thereabouts. As the cooler 19 is disposed within the CZ furnace, an increase in the temperature gradient of the body of a single crystal results in miniaturization of crystalline imperfections. Simultaneously, the rate at which a silicon single ingot is to be pulled can be increased, and the production efficiency of a silicon ingot can be improved.

[Movement of the Cooler]

<A Cooler Hoisting-and-Lowering Machine (for Moving the Cooler Linearly in the Vertical Direction)>

The CZ single crystal puller according to the present invention is characterized in that the cooler 19 having a cooling pipe through which cooling water circulates is moved within the CZ furnace. In the present embodiment, the movement of the cooler 19 is embodied by "hoisting and lowering action."

As shown in FIG. 1, the CZ silicon single crystal puller according to the present invention is equipped with a hoisting-and-lowering machine 25 for vertically moving the cooler 19 within the CZ furnace. By means of actuation of the hoisting-and-lowering machine 25, a cooling pipe stack of the cooler 19 surrounding the pulled single crystal 17 is moved vertically.

FIG. 2 is a block diagram for describing the function and configuration of the hoisting-and-lowering machine 25. In the drawing, those elements which are the same as the elements shown in FIG. 1 are assigned the same reference numerals, and repetition of their explanations is omitted. For convenience of brief explanation, members and constituent elements which are unnecessary for explanation are omitted, and members and constituent members which are omitted from FIG. 1 are sometimes added for explanation, as required.

As shown in FIG. 2, in the present embodiment, the hoisting-and-lowering machine 25 comprises a hoisting-and-lowering block 23a attached to an upper part of the bellows member 23 (a bridging member); a screw-threaded shaft 25a screwed into the hoisting-and-lowering block 23a; and a motor 26a for rotating the screw-threaded shaft 25a. In the present embodiment, the hoisting-and-lowering block 23a and the screw-threaded shaft 25a are screwed together by means of a ball screw.

The hoisting-and-lowering machine 25 having the foregoing configuration has the advantage of the ability to axially move the hoisting-and-lowering block 23a without fail and change the travel speed of the same freely and accurately. More specifically, there can be effected sudden stoppage of the hoisting-and-lowering block 23a and a change in the moving speed of reverse rotation of the same, as well as uniform motion of the hoisting-and-lowering block 23a in the axial direction of the screw-threaded shaft 25a.

In the CZ single crystal puller according to the present invention, a pull rate can be switched in two steps; namely, a rate of 30 mm/min. and a rate of 300 mm/min. As will be described later, this switching function is utilized for ensuring the safety of the puller.

In the hoisting-and-lowering machine 25 of the foregoing embodiment, when the motor 26a serving as a drive mechanism is stopped, the cooler 19 is supported and maintained in position. Hence, energy conservation is attained.

All hoisting-and-lowering machines to be described in the embodiment must be formed from stainless steel so as to be shielded from a magnetic field applied to a silicon melt as shown in FIG. 1. Alternatively, the hoisting-and-lowering machines must be positioned at a location where they are not affected by the magnetic field, or must be covered with a housing. Thus, any measures must be taken to shield the hoisting-and-lowering machines from a magnetic field.

<Movement of the Cooler in Inclined Directions>

Figure 3:
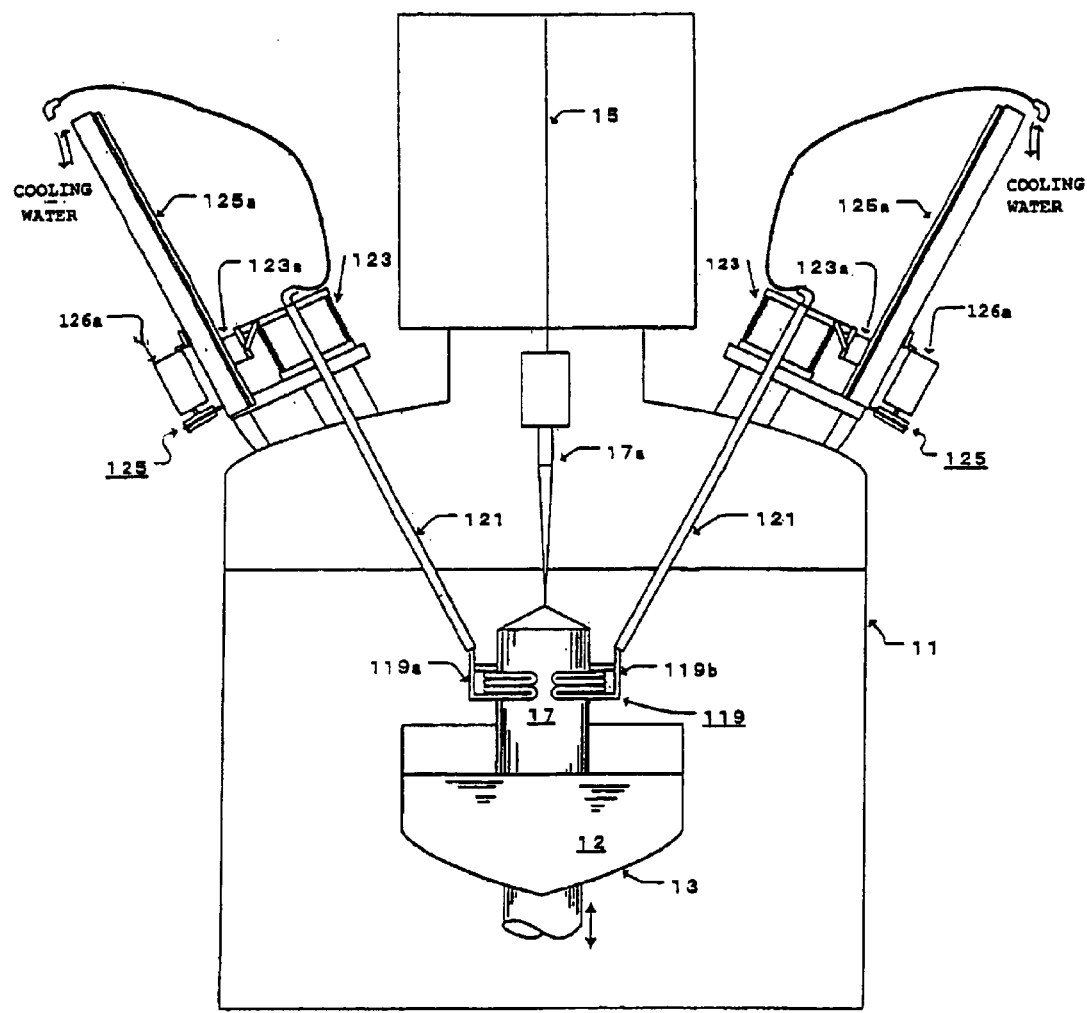
FIG. 3 is a block diagram for describing an embodiment in which a cooler is moved in an inclined direction.

FIG. 3 is a block diagram for describing an embodiment in which the cooler 19 is moved in inclined directions. In the drawing, those elements which are the same as the elements shown in FIGS. 1 and 2 are assigned the same reference numerals, and functionally-equivalent elements are denoted by reference numerals formed by adding 1 as a prefix to the reference numeral of the corresponding elements shown in FIGS. 1 and 2.

As shown in FIG. 3, a hoisting-and-lowering machine used for moving the cooler in inclined directions is identical with that used for moving the cooler 19 shown in FIG. 1 in the vertical direction. However, the cooler differs from the cooler 19 in that a cooling pipe stack constituting the cooler is divided into two segments. In the CZ silicon single crystal puller equipped with a cooler according to the present invention, when the cooler is moved in inclined directions, the cooling pipe stack can be opened by virtue of such a characteristic construction of the cooler.

The construction and operation of the CZ silicon single crystal puller equipped with a cooler 119 according to the present embodiment will be described more specifically. A hoisting-and-lowering machine 125 used for moving, in inclined directions, the cooler 119 formed from the cooling pipe stack is essentially identical in construction with the hoisting-and-lowering machine 25 shown in FIG. 1. Each hoisting-and-lowering machine 125 comprises a hoisting-and-lowering block 123a (a bridging member) attached to an upper part of a bellows member 123; a screw-threaded shaft 125a screwed to the hoisting-and-lowering block 123a; and a motor 126a used for rotating the screw-threaded shaft 125a. In the present embodiment, the hoisting-and-lowering block 123a and the screw-threaded shaft 125a are screwed together by means of a ball screw, as in the case of the hoisting-and-lowering machine 25 shown in FIG. 1.

Figure 4A:
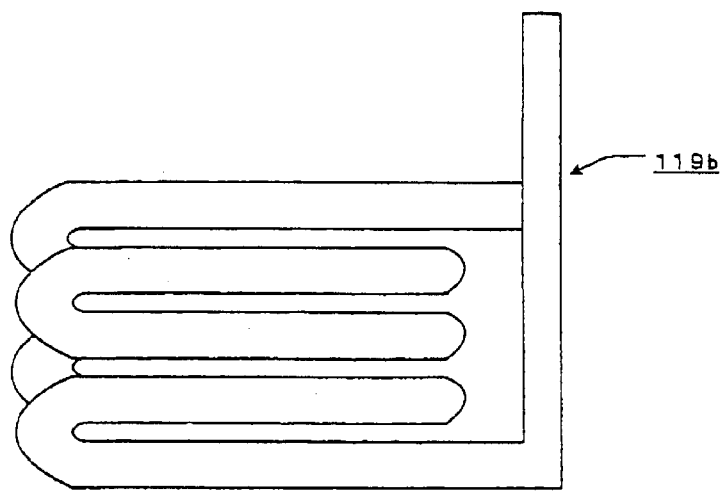
Figure 4B:
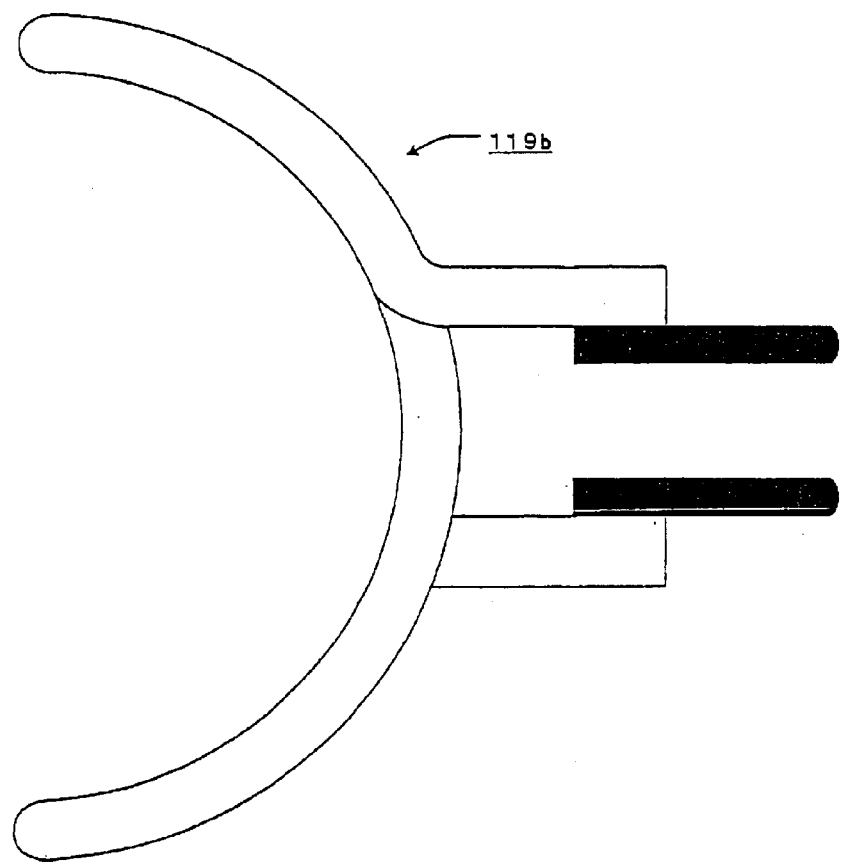

The cooler 119 according to the present invention is characterized in that the cooler 119 formed from a cooling pipe stack is divided into two segments; that is, cooler blocks 119a and 119b. As illustrated in FIGS. 4A and 4B, each of the cooler blocks 119a and 119b is formed into a semi-circular form by means of coiling a cooling pipe. When the two cooler blocks 119a and 119b are joined together, a cylindrical shape is formed (see FIG. 5A). By means of such a construction, even when the cooler is moved in inclined directions, the cooler can cool a predetermined position on a single crystal. Further, if cooling is not required, the cooler can be moved to another shunting position.

Such a cooler 119 which moves in inclined directions is not suitable for changing a cooling position on a single crystal. However, in contrast with the cooler which moves in a vertical direction shown in FIG. 1, the cooler 119 has the advantage of ability to accurately, easily, and quickly set or reset environmental conditions for cooling and pulling.

Figure 5A:
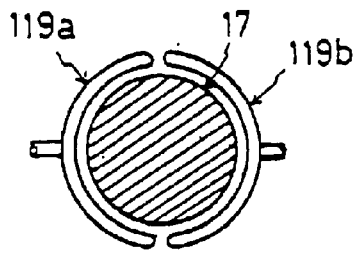
FIGS. 5A through 5D are illustrations showing embodiment variations of cooling stacks.
Figure 5B:
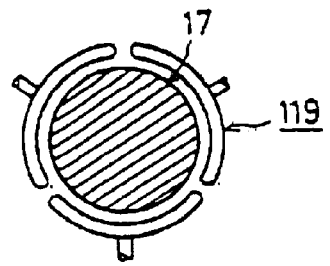
Figure 5C:
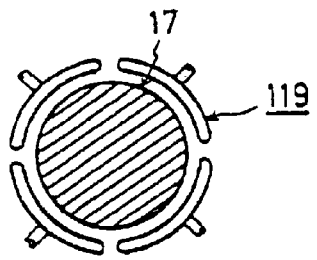
Figure 5D:
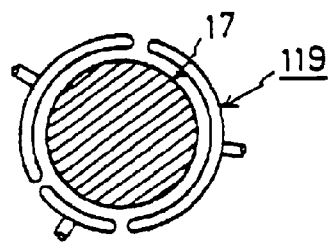

In the present embodiment, each of the cooler blocks 119a and 119b constituting the cooler 119, which cooler moves in inclined directions, assumes a semi-circular shape (see FIG. 5A). However, the cooler blocks are not limited to the semi-circular shape. A cooler of any geometry can be employed, so long as all the segments of a cooler constitute a cylindrical or nearly-cylindrical shape when integrated together. For instance, there may be employed a cylindrical cooler which is divided into three equal segments at a central angle of 120° (see FIG. 5B) or a cylindrical cooler which is divided into four equal segments at a central angle of 90° (see FIG. 5C). As a matter of course, the central angles of segments at which a cooler is to be divided may be non-uniform (see FIG. 5D).

<Pivotal Movement>

Figure 6A:
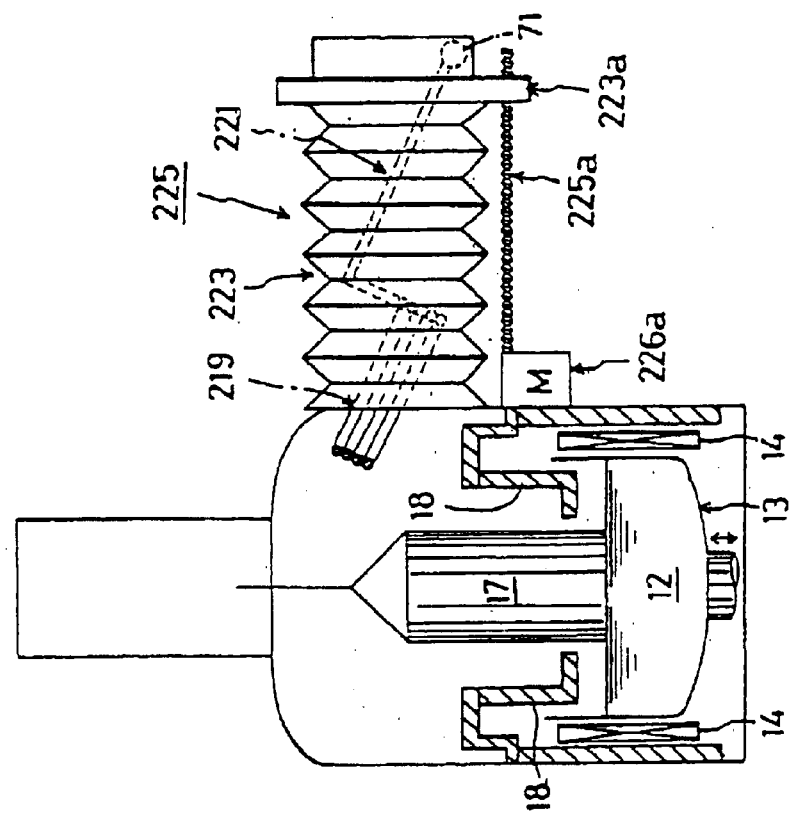
FIGS. 6A and 6B are block diagrams for illustrating embodiments of the CZ silicon single crystal puller equipped with a cooler, which cooler performs rotational movement.
Figure 6B:
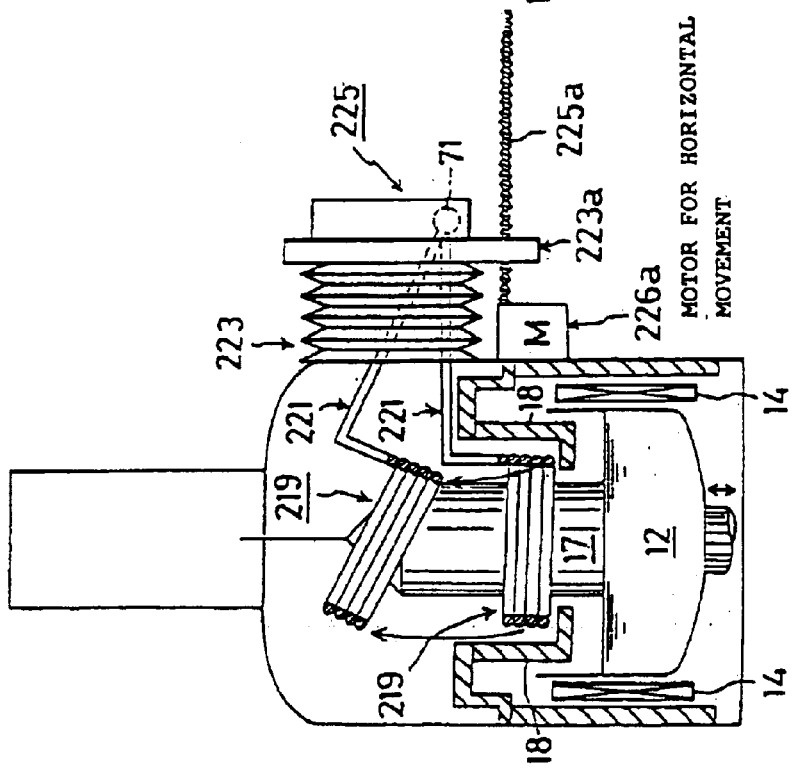

FIGS. 6A and 6B are block diagrams for describing an embodiment of a CZ silicon single crystal puller equipped with a cooler, which cooler performs pivotal movement (hereinafter called a "pivotally-movable cooler"). In the drawings, those elements which are the same as the constituent elements of the silicon single crystal puller equipped with a vertically-movable cooler shown in FIG. 1 are assigned the same reference numerals, and functionally-equivalent elements are assigned reference numerals formed by adding 2 as a prefix to the reference numerals of corresponding elements shown in FIG. 1.

As illustrated in FIGS. 6A and 6B, a pivotally-movable cooler 219 is also formed from a cooling pipe stack, as is the vertically-movable cooler 19. The cooler 219 cools a single crystal by means of cooling water circulating through the cooling pipe.

This pivotally-movable cooler 219 is characterized in that the cooler 219 is moved while being pivotally moved about a pivotal axis 71. In the CZ silicon single crystal puller shown in FIGS. 6A and 6B, after the cooler 219 has been lifted to a higher position by means of pivotal movement of the cooler 219 (FIG. 6A), the bellows member 223 is extended, whereby the cooler 219 is housed in the bellows member 223 (see FIG. 6B).

Expansion and contraction of the bellows member 223 are performed by a horizontal movement machine 225. The horizontal movement machine 225 has the same construction as that used for moving the vertically-movable cooler 19 shown in FIG. 1 or that used for hoisting and lowering the cooler 119 which moves in inclined directions shown in FIG. 3. The horizontal movement machine 225 comprises a movable block 223a attached to the end of the bellows member 223, a screw-threaded shaft 225a screwed to the movable block 223a, and a motor 226a for rotating the screw-threaded shaft 225a. As in the case of the hoisting-and-lowering machines set forth, the movable block 223a of the horizontal movement machine 225 moves horizontally in association with rotation of the motor 226a, thereby performing expansion or contraction of the bellows member 223 and the loading/unloading of the cooler 219.

Figure 7:
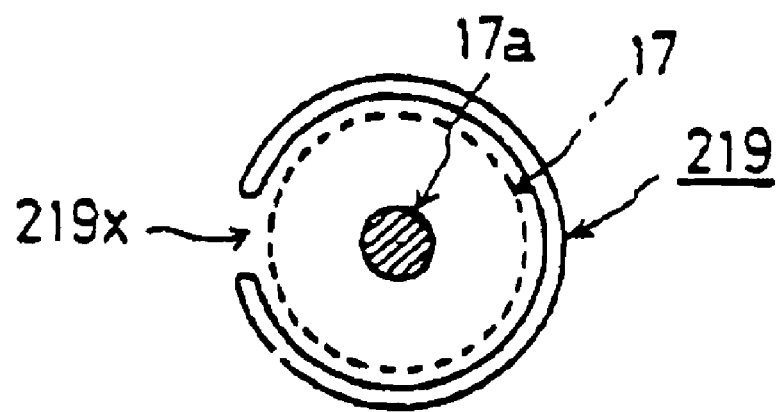
FIG. 7 is an illustration showing an embodiment of the cooling stack of the cooler which performs rotational movement.

In the CZ silicon single crystal puller equipped with the pivotally-movable cooler 219, the cooler 219 assumes an imperfect cylindrical shape so that the cooler 219 can be removed from the single crystal 17 when the cooler 219 is lifted, as shown in FIG. 7. Basically, the cooler 219 must assume a clearance 219x that is greater than the diameter of the seed crystal 17a. Instead of adopting a cooler of this type, the separated cooler shown in FIGS. 5A through 5D may be employed.

[Removal of the Cooler]

The cooler 219 is removed by means of removal of the supply-and-exhaust pipe 21 from the CZ furnace after pulling of a silicon single ingot has been completed.

In order to explain the cooler removal operation and relevant members, a CZ silicon single crystal puller equipped with the vertically-movable cooler 19 shown in FIG. 1 is taken as an example. So long as a puller is equipped with a cooler formed from a cooling pipe, the following descriptions can be applied in the same manner to another type of puller.

The cooler 19 is removed by means of removing the supply-and-exhaust pipe 21 (consisting of the pipes 21a and 21b) from the CZ furnace after pulling of a silicon single crystal ingot has been completed. As shown in FIGS. 8A through 8D, the cooler 19 is fixed to the hoisting-and-lowering block 23a by means of a fixing jig 60 provided on top of the bellows member 23. After removal of the cooler 19, a closure 70 is prepared for closing holes which would be formed in the hoisting-and-lowering block 23a after removal of the cooler 19. The closure 70 is provided for the case where the cooler 19 is removed. In order to impart compatibility to the closure 70, the fixing jig 60 and the closure 70 are formed so as to assume homologous shapes.

Figure 8B:
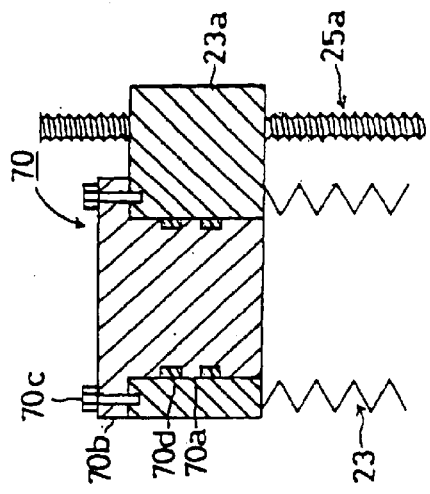

More specifically, as shown in FIGS. 8A through 8D, the fixing jig 60 and the closure 70 are basically constructed such that a flange member extending in parallel with the exterior surface of the hoisting-and-lowering block 23a is fixed to the hoisting-and-lowering block 23a by means of screws. As shown in FIG. 8B, the closure 70 is constituted of a disk-shaped flange 70b fixed to the top of a columnar body 70a. While being fitted into the hoisting-and-lowering block 23a, the closure 70 is fixed by means of a screw 70c. An O-ring 70d is fitted around the cylindrical body 70a for ensuring airtightness.

Figure 8D:
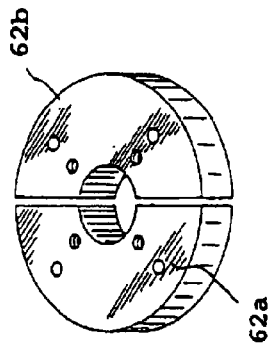
Figure 8A:
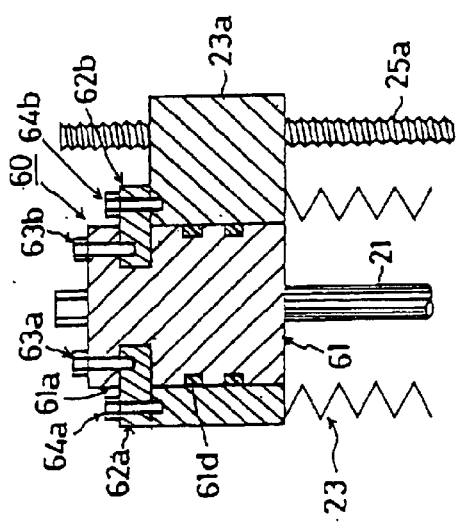
Figure 8C:
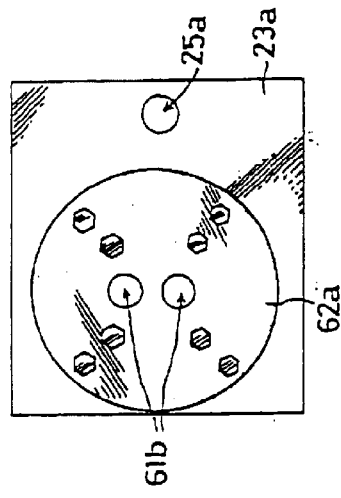

As shown in FIG. 8A, the fixing jig 60 is constituted of a columnar body 61 having a circumferential groove 61a formed therein, and a pair of semi-circular-ring-shaped plate members 62a and 62b (see FIG. 8D). The plate members 62a and 62b are fitted into the groove 61a. Through holes 61b are formed in the columnar body 61 so as to permit insertion of the supply-and-exhaust pipe 21 (consisting of the pipes 21a and 21b) (FIG. 8C). As in the case of the body 70a of the closure 70, an O-ring 61d is fitted around the columnar body 61 for ensuring airtightness.

In such a fixing jig 60, the paired semi-circular ring-shaped plates 62a and 62b are fitted into the groove 61a formed in the columnar body 61. In this state, the semi-circular ring-shaped plates 62a and 62b are fixed to the columnar body 61 by means of the screws 63a and 63b. As a result, the fixing jig 60 assumes a columnar shape, in conjunction with a flange member, and can exhibit the same capability as that of the closure 70. In the fixing jig 60 of this state, the flange sections of the semi-circular ring-shaped members 62a and 62b are fixed to the hoisting-and-lowering block 23a by means of the screws 64a and 64b.

As mentioned above, the fixing jig 60 and the closure 70 (wherein the fixing jig 60 assumes a bolt-like shape when the semi-circular ring-shaped members 62a and 62b are fitted to the columnar body 61) are fitted into the hole of the hoisting-and-lowering block 23a as a bolt-like member without threads. The fixing jig 60 and the closure 70 are compatible and constitute a single set. Hence, the cooler 19 can be readily removed from the CZ furnace. Switching between a CZ furnace equipped with a cooler and a CZ furnace not equipped with a cooler can be effected readily and freely. A CZ single crystal puller may be easily used with a CZ furnace having a cooler or with an ordinary CZ furnace not having a cooler, according to individual circumstances.

[Recharge and Additional Charge]

A quartz crucible is damaged by heating at the time of melting of polysilicon materials. In most cases, the quartz crucible is discarded every pulling process. If the amount (size) of single crystal to be pulled in a single pulling process can be increased, manufacturing costs can be reduced correspondingly. Even when the same amount of single crystal is produced, the number of repetitions of processes, such as cooling and heating processes, can be diminished. The time required for producing a given amount of single crystal can be diminished, and the production efficiency of single crystal can be improved in terms of the overall manufacturing process. Particularly, if the amount of single crystal to be pulled can be increased to a useful limit of a quartz crucible for pulling a single crystal, the effects of cost reductions can be maximized.

Recharge and additional charge operations are measures for achieving the effects mentioned above. As shown in FIG. 9A, according to additional charge operation, when polysilicon materials are melted in a quartz crucible, the crucible is not fully charged with polysilicon materials, for reasons of bulkiness of polysilicon material. Polysilicon material is additionally added to a melt of material, to thereby increase the amount of melt. Subsequently, a single crystal is pulled in the same manner as in an ordinary case.

As shown in FIG. 9B, according to recharge operation, after pulling of a single crystal has been completed to a certain extent, polysilicon material is charged to a crucible, and pulling of the single crystal is resumed.

The recharge and additional charge operations enable an increase in the amount (size) of single crystal which can be pulled in a single pulling process, thus diminishing manufacturing costs. Since these operations do not involve significant heating or cooling of a crucible, shortening of crucible life is prevented, thus extending a heating time. Even in this respect, the length of a single crystal to be pulled in a single operation can be increased by the amount corresponding to an increase in a heating time. If a cooler is used for a recharge or additional charge operation, the overall production efficiency can be increased by virtue of an increase in the amount of single crystal to be pulled per unit time as a result of an increase in the pull rate induced by use of the cooler.

In order to cause the cooler 19 and the thermal insulation member 18 to sufficiently exhibit their capabilities, they are disposed at positions closest to the surface of a melt. However, at the time of recharge or additional charge operation, the surface of ascending melt may touch them, or they may be splashed with a melt. For these reasons, arranging the cooler 19 and the thermal insulation member 18 near a melt surface is not preferable.

The same problems arise when material is charged to a crucible by means of an ordinary charging operation. Hence, realization of a fully-charged state for increasing production efficiency inevitably involves an increase in the amount of polysilicon material to be piled up. In such a case, polysilicon material piled in an upper position falls during the course of melting operation, whereupon the cooler 19 and the thermal insulation member 18 may be splashed with a melt of material.

Figure 10:
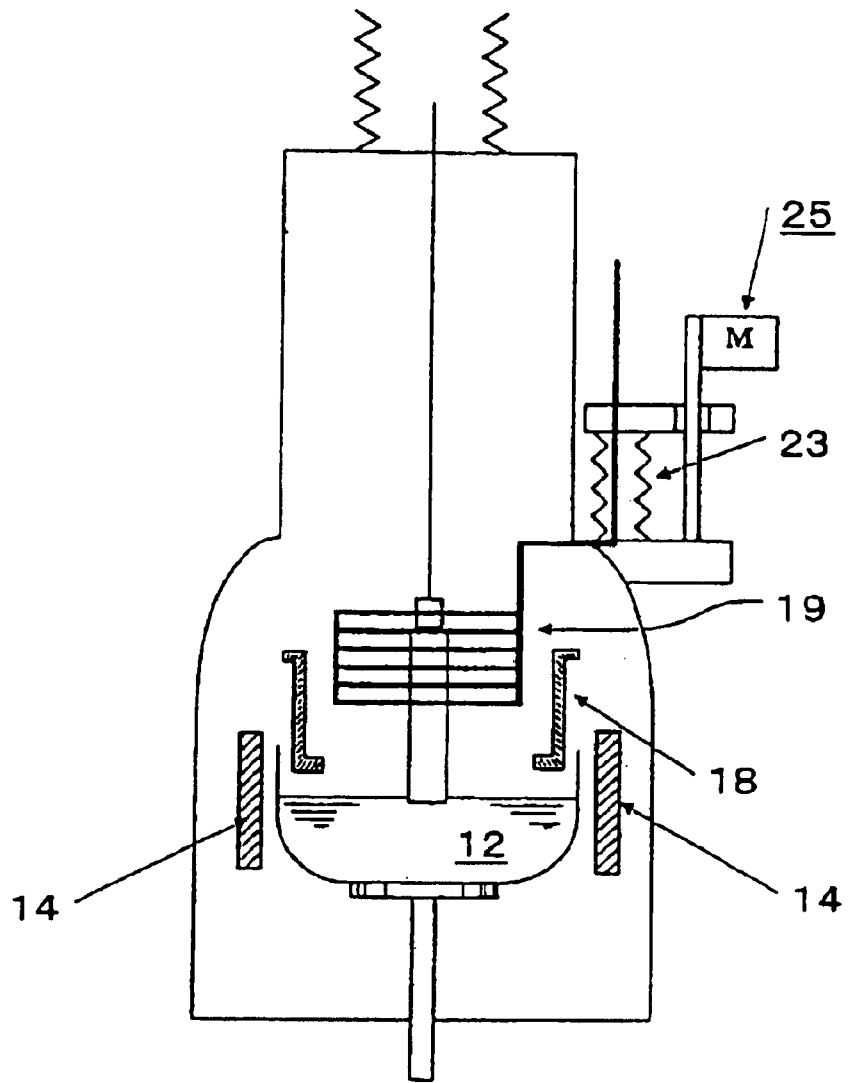
FIG. 10 is a block diagram for describing the operations of the puller effected during the additional charge process and the recharge process.

In order to solve such problems, the CZ silicon single crystal puller equipped with a cooler according to the present invention moves the cooler and the thermal insulation member to their higher, retracted positions at the time of charging material into a crucible, melting material, and recharge or additional charge operation (see FIG. 10). In this case, the previously-described hoisting-and-lowering mechanism may be used as a mechanism for moving a cooler. Further, in terms of working efficiency, the cooler and the thermal insulation member are preferably moved to their higher, retracted positions at high speed (300 mm/min.).

Figure 11:
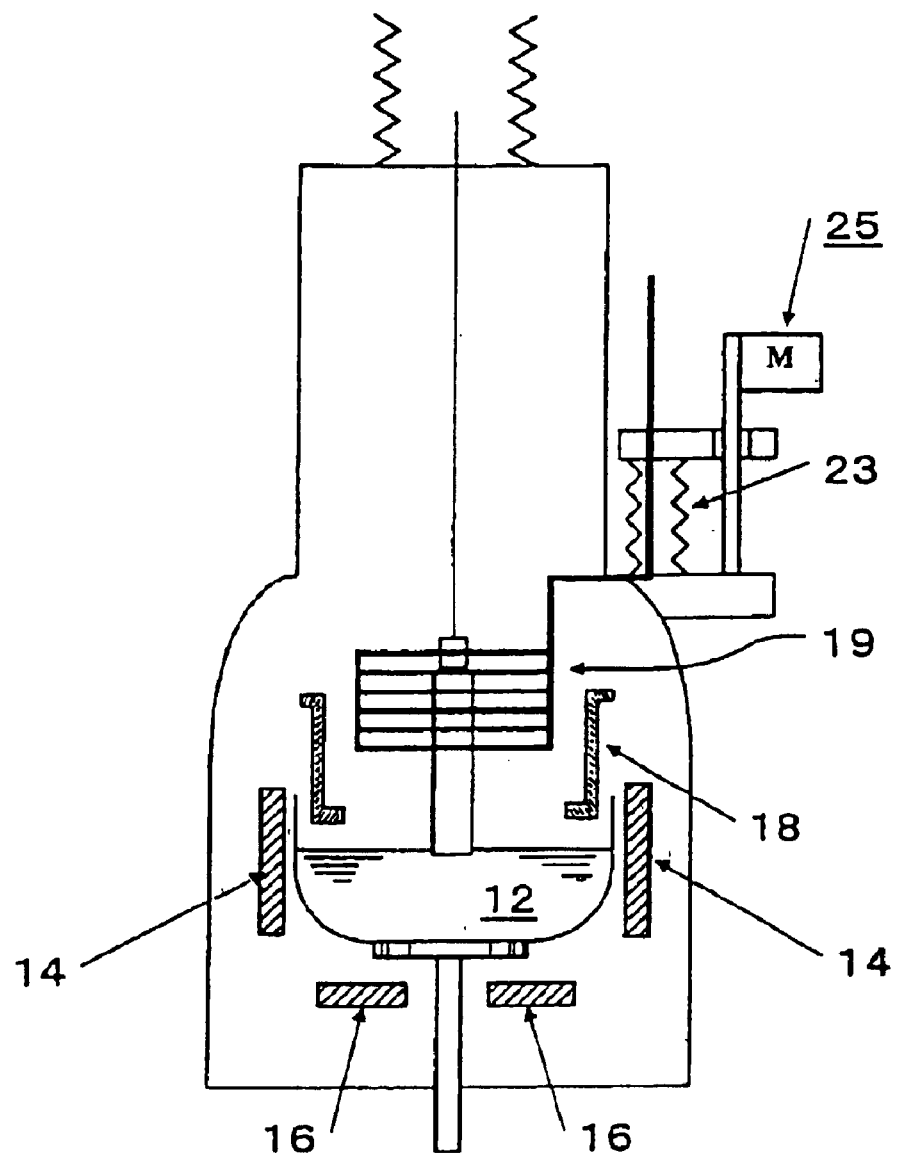
FIG. 11 is a block diagram for describing the operations of the puller effected during the additional charge process and the recharge process, and is an illustration for describing an embodiment in which bottom heaters are included therein.

If the foregoing technique according to the present invention is employed, in a case where heating power is increased by means of additionally providing, for example, a bottom heater 16 to the CZ furnace as shown in FIG. 11, the cooler 19 and the thermal insulation member 18 are moved to their higher, retracted positions, thus protecting them from splash of a melt. As a result, increased heating power can be effectively utilized for melting material.

[Movement of the Thermal Insulation Member Following the Cooler]

FIGS. 12A through 12D are longitudinal cross-sectional views of the CZ furnace for describing the construction and function of the thermal insulation member and those of the cooler according to the present invention.

Figure 12A:
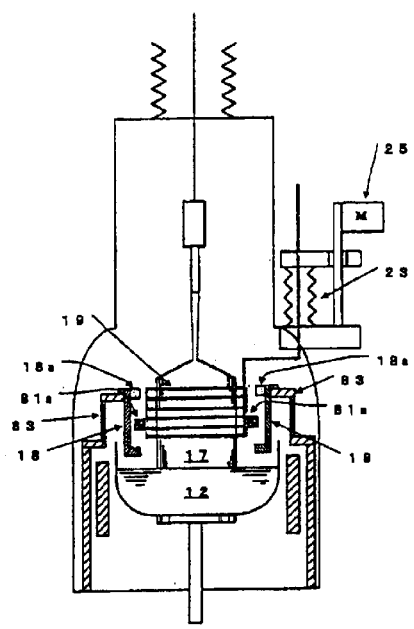
FIGS. 12A through 12D are illustrations for describing embodiments in which a thermal insulation member 18 is hoisted along with a cooler 19.

As shown in FIG. 12A, the present invention is characterized in that a tab member 81a is attached to the side of the cooler 19 and that an engagement member 18a to be engaged with the tab member 81a is provided on the interior wall surface of the thermal insulation member 18. The thermal insulation member 18 is simply placed on a table member 83 within the CZ furnace without use of screws or bonding. Hence, so long as the thermal insulation member 18 is lifted, the member 18 can be easily detached from the table member 83.

Figure 12B:
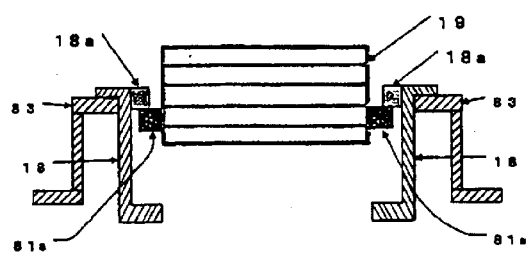
Figure 12C:
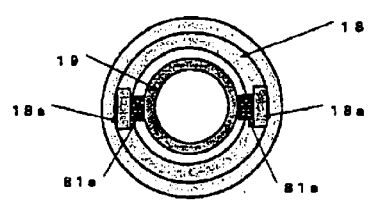

As shown in FIGS. 12B and 12C, in the CZ single crystal puller equipped with a cooler according to the present invention, when the cooler 19 is located in an ordinary position, the tab member 81a is not engaged with the engagement member 18a, and the cooler 19 and the thermal insulation member 18 remain in their ordinary states. As illustrated, the tab member 81a and the engagement member 18a are arranged in a positional relationship in which they are to engage. Hence, when the cooler 19 is hoisted, the tab member 81a is engaged with the engagement member 18a. Accordingly, the thermal insulation member 18 is also lifted and separated from the table member 83 along with the cooler 19.

Figure 12D:
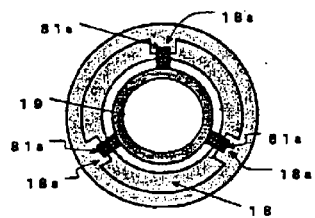

As shown in FIG. 12C, the tab member 81a is provided not over the entire circumference of the cooler 19, but in several positions along the circumference of the cooler 19. Similarly, the engagement member 18a is provided on several positions along the interior circumference of the thermal insulation member 18. In the example shown in FIG. 12C, two tab members 81a and two corresponding engagement members 18a are provided. Alternatively, three tab members 81a and three corresponding engagement members 18a may be provided on the cooler 19 and the thermal insulation member 18, respectively, as illustrated in FIG. 12D. Further alternatively, they may be provided in a number greater than three in consideration of the overall function of a CZ single crystal puller.

FIGS. 13A through 13D are illustrations for describing the operation of the cooler 19 and that of the thermal insulation member 18 according to the present invention. In these drawings, those elements which are identical with the constituent elements shown in FIG. 11 and FIGS. 12A through 12D are assigned the same reference numerals, and repetition of their explanations is omitted.

Figure 13A:
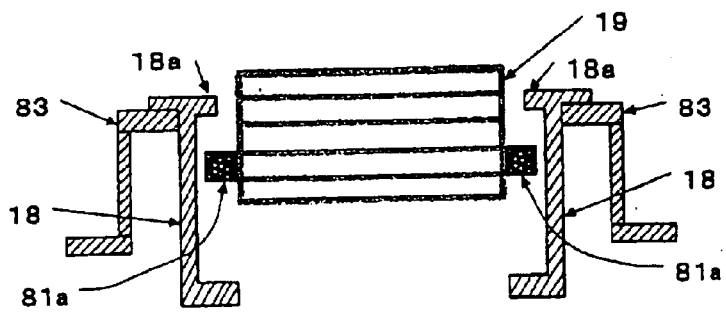
FIGS. 13A through 13D are illustrations for describing the operation of the puller effected in the embodiments in which the thermal insulation member 18 is hoisted along with the cooler 19.
Figure 13B:
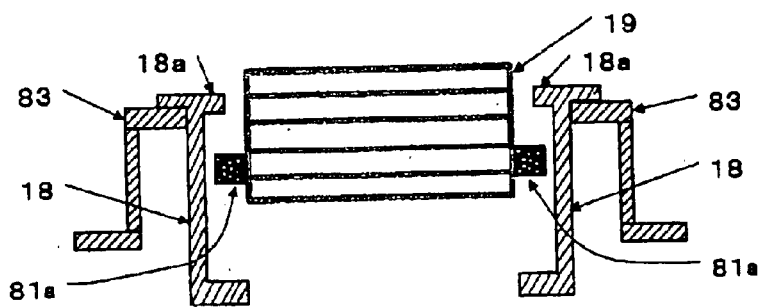
Figure 13C:
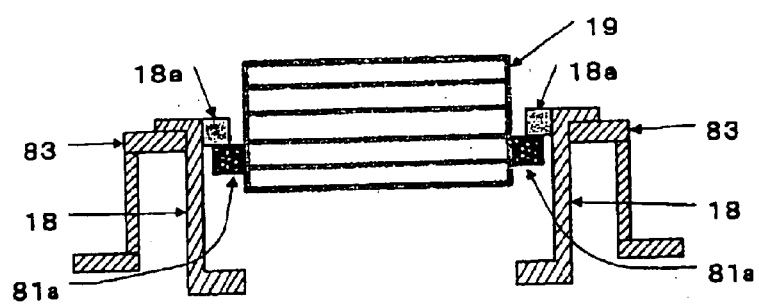
Figure 13D:
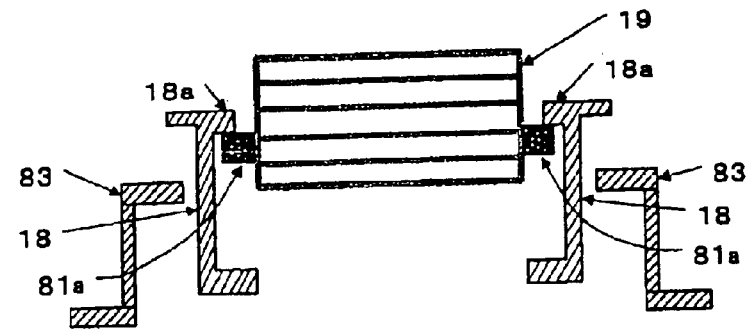

As shown in FIG. 13A, the cooler 19 is placed at a home position; that is, at a lowest-level position. As shown in FIG. 13B, the cooler 19 is hoisted. When the tab member 81a is engaged with the engagement member 18a, as shown in FIG. 13C, the thermal insulation member 18a is lifted (FIG. 13D). Conversely, as shown in FIG. 13B, the cooler 19 can be freely moved in the vertical direction independently of the thermal insulation member 18 until the tab member 81a is engaged with the engagement member 18a.

Figure 14:
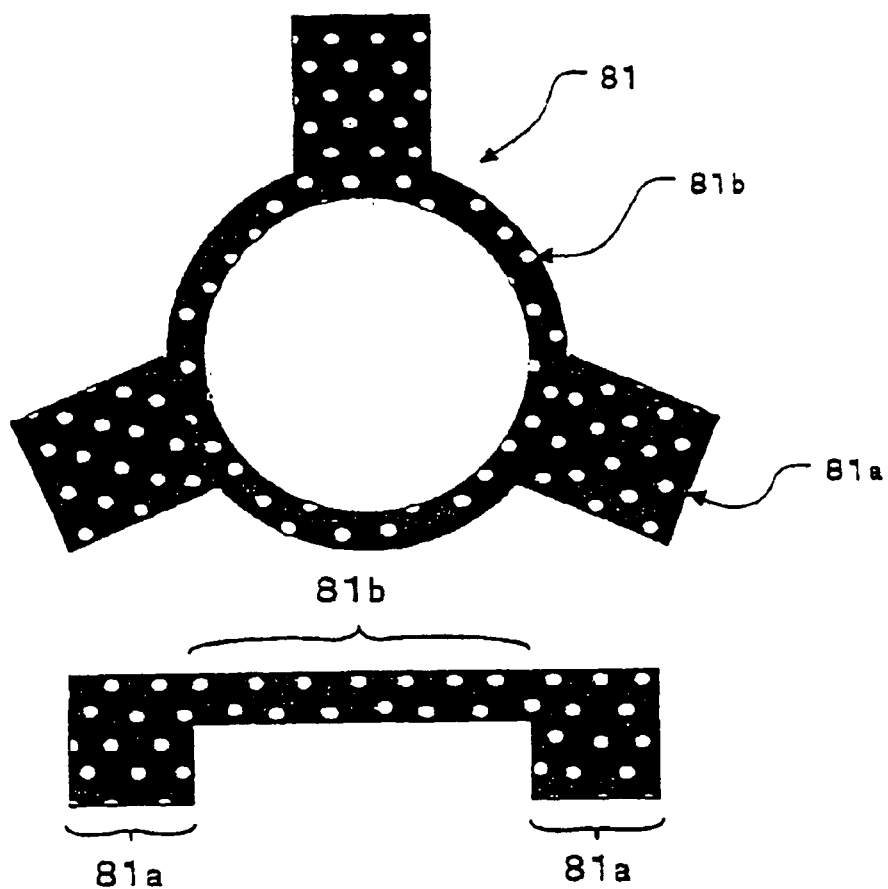
FIG. 14 is an illustration for describing the construction of a support plate 81.

In a case where the tab member 81a is bonded to the side surface of the metal cooler 19, difficulty is usually encountered in ensuring the strength sufficient for establishing engagement with and lifting the thermal insulation member 18. Accordingly, in a preferred embodiment, the support plate 81 such as that shown in FIG. 14 is formed. The support plate 81 is then inserted into a helical indent formed in the coiled cooling pipe of the cooler 19 such that the tab members 81a project from the side wall of the cooler 19.

More specifically, the support plate 81 is constituted of an annular portion 81b to be inserted into the helical indent of the cooler 19, and the tab members 81a projecting outward from the annular portion 81b. When the support plate 81 is fitted into the cooler 19, the tab members 81a project from the side wall of the cooler 19, as illustrated in any of FIGS. 13A through 13D. The tab members 81a project from the side wall of the cooler 19, and the tab members 81a can offer strength sufficient for lifting the thermal insulation member 18. The support plate 81 can be formed from heat-resisting material, such as carbon material.

In the CZ single crystal puller equipped with a cooler according to the present invention, the cooler 19 is moved to a higher position away from the surface of a melt at the time of initial melting of material or at the time of melting of material with a recharge or additional charge operation, in order to shorten a melt time. At this time, in the present embodiment, the thermal shield member 18 is also moved to a higher position along with the cooler 19. Hence, the thermal shield member 18 casts a shadow on the cooler 19, thus shielding the cooler 19 from the melt surface. As a result, the efficiency of heating for melting material is increased. When material is initially melted, or when material is recharged or additionally charged, the proportion of output of, particularly, the bottom heater 16 is preferably increased at the time of melting material, thus shortening a melt time.

Vertical movement of the cooler 19 is performed at high speed when the cooler 19 is moved to a higher position for the reason set forth, or to a retracted position for safety. In contrast, when the cooler 19 is lowered to a lower position during growth of crystal, the cooler 19 is lowered gradually in order to avoid occurrence of sudden changes in thermal environment.

Although the additional charge and recharge operations have been described herein by means of taking, as an example, the CZ single crystal puller equipped with a vertically-movable cooler, one of the objectives of the present invention can be achieved so long as the cooler has been moved to a position away from a melt or a crucible when additional charge or recharge operation is performed. Hence, it is evident that the present invention can be applied to various CZ single crystal pullers, such as a CZ single crystal puller equipped with a cooler which moves in inclined directions and a CZ single crystal puller equipped with a pivotal cooler.

[Dash's Neck Method and Cooler]

Through their studies, the present inventors have found that, when a cooler is present close to a seed crystal during the course of drawing of a seed crystal according to the Dash's neck method, dislocations due to thermal shock fail to be eliminated from the seed crystal, thus hindering manufacture of a single crystal (see Table 1).

TABLE 1

| REQUIREMENTS FOR ENABLING ELIMINATION OF DISLOCATIONS (TEST DATA) | | | | | |
|---|---|---|---|---|---|
| S: DISTANCE BETWEEN MELT AND LOWER END OF THERMAL INSULATION MEMBER (mm) | 20 | 30 | 40 | 20 | |
| C: DISTANCE BETWEEN MELT AND LOWER END OF COOLER (mm) | 75 | 125 | 85 | 115 | — |
| PERCENT ELIMINATION OF DISLOCATIONS (DENOMINATOR IS THE NUMBER OF TESTS) | 0/3 | 0/1 | 15/15 | 1/1 | 15/15 |

As shown in Table 1, when the distance between the thermal insulation member 18 and the melt surface was 20 mm, dislocations could not be removed from a seed crystal, regardless of whether the distance between the cooler 19 and the melt surface was small (75 mm) or large (125 mm) (as shown in Table 1, the percent elimination of dislocations is 0% in either case). In contrast, when the distance between the thermal insulation member 18 and the melt surface was 30 or 40 mm, a percent elimination of dislocations of 100% was achieved, regardless of whether the distance between the cooler 19 and the melt surface was small (85 mm) or large (115 mm) (as shown in Table 1, dislocations were eliminated from all 15 crystals when the distance between the thermal insulation member 18 and the melt surface was 30 mm). In contrast, when no cooler was disposed in the CZ furnace (the rightmost column in Table 1), the percent elimination of dislocations of 100% was attained even when the distance between the thermal insulation member 18 and the melt surface was 20 mm.

As mentioned above, when no cooler is present in the CZ furnace, dislocations can be eliminated from a seed crystal even when the lower end of the thermal insulation member is located in the vicinity of the melt surface. However, it is understood that, when a cooler is present in the CZ furnace, elimination of dislocations becomes impossible if the lower end of the thermal insulation member is spaced a certain distance away from the melt surface (i.e., a distance of at least 30 mm or thereabouts from the melt surface).

Figure 15:
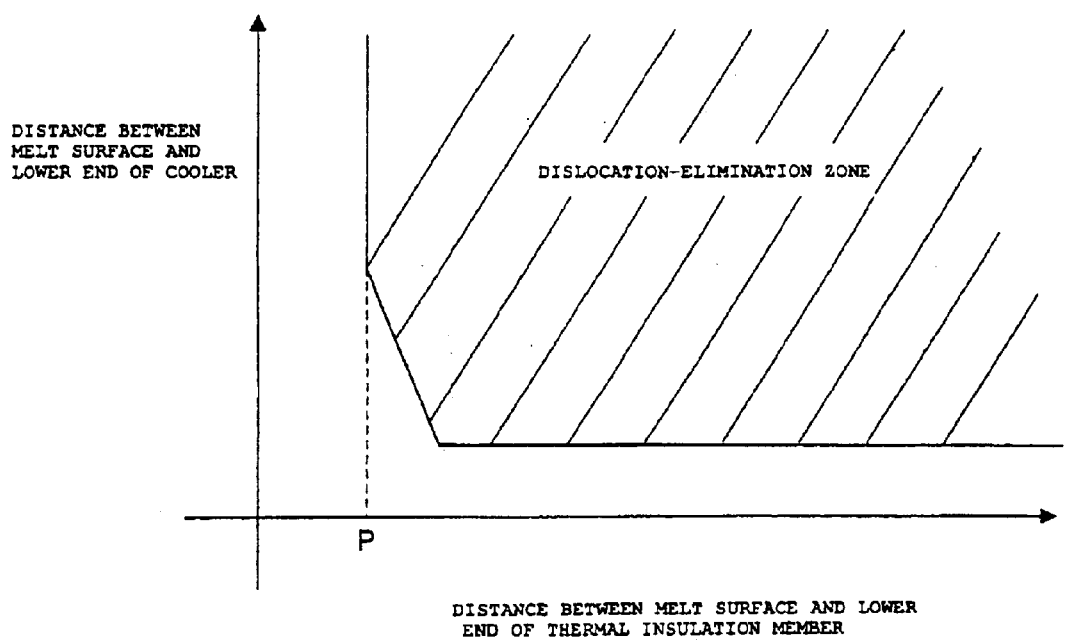
FIG. 15 is a conceptual rendering showing an area where dislocations can be removed by means of the Dash's neck method, which area is defined by the relationship between the distance from the surface of a melt to the lower end of the thermal insulation member and the distance from the surface of the melt to the lower end of the cooler.

On the basis of such data, there is assumed an area in which elimination of dislocations becomes feasible (hereinafter the area will be called a "dislocation-elimination range"), as shown in FIG. 15. Specific numerals related to a boundary region of the dislocation-eliminating range shown in FIG. 15 are determined by means of the size and status of a CZ furnace and the geometries of members used within the furnace. For instance, in the present embodiment, point P in the drawing is 30 mm.

When the cooler 19 and the thermal insulation member 18 are located close to the melt surface, dislocations are not eliminated. In other words, elimination of dislocations from a seed crystal by use of the Dash s neck method involves separation of the thermal insulation member 18 and the cooler 19 from the melt surface.

Accordingly, in the present invention, the cooler 19 and the thermal insulation member 18 are controlled so as to be separated from the melt surface during the course of elimination of dislocations by use of the Dash's neck method. The distance over which the cooler 19 and the thermal insulation member 18 are to be separated from the melt surface is determined after boundary conditions of the dislocation-eliminative range shown in FIG. 15 have been specifically determined in accordance with the size and status of a CZ furnace and geometries of members to be used in the CZ furnace. The cooler 19 and the thermal insulation member 18 are moved so as to enter the dislocation-elimination range.

After dislocations have been sufficiently eliminated from a seed crystal by use of the Dash's neck method, the cooler 19 and the thermal insulation member 18 are lowered, and a single crystal is pulled while being cooled. During the course of this operation, the cooler 19 and the thermal insulation member 18 are basically and preferably moved at a high speed (300 mm/min.), in consideration of working efficiency.

The operation of the cooler effected for eliminating dislocations from a crystal by use of the Dash's neck method has been described, by means of taking a CZ single crystal puller equipped with the vertically-movable cooler according to the present invention. One objective of the present invention is to separate a cooler and a thermal insulation member at a predetermined distance from a melt surface during the course of elimination of dislocations by use of the Dash's neck method. Hence, it is evident that the present invention can be applied to various CZ single crystal pullers, such as a CZ single crystal puller equipped with a cooler which moves in inclined directions and a CZ single crystal puller equipped with a pivotal cooler.

[Relationship between the Travel Speed and Position of the Cooler for All Single-Crystal Pulling Processes]

Figure 16:
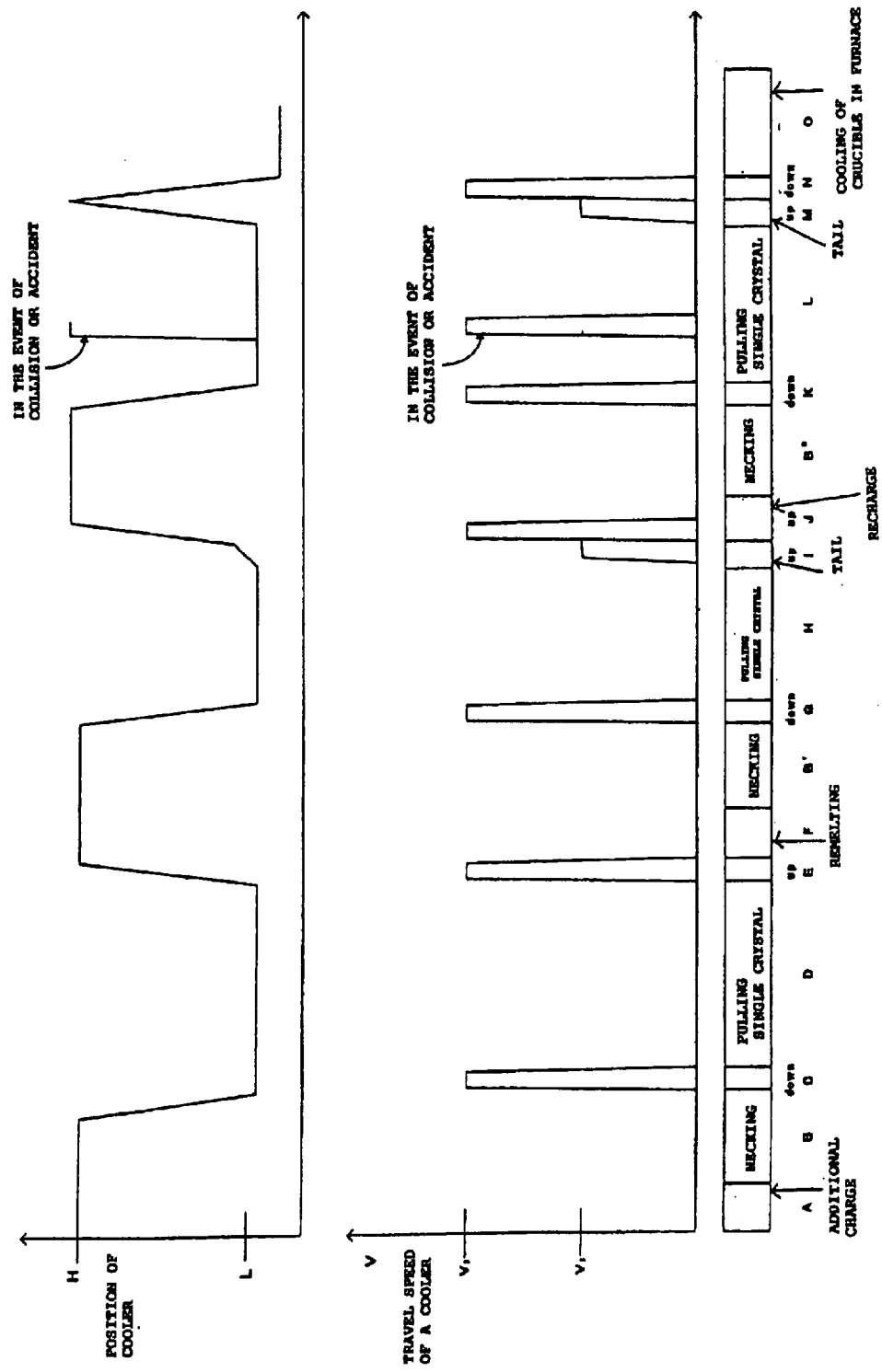
FIG. 16 is a chart for describing the hoisting and lowering operation of the cooler according to the present invention, showing the position of the cooler (provided in an upper portion of the drawing) and a travel speed (provided in a lower portion of the drawing) with lapse of time.

FIG. 16 is a graph for describing the operation of the CZ single crystal puller equipped with a cooler according to the present invention. A lower graph shows a travel speed of a cooler, and an upper graph shows the position of the cooler.

In a process for performing an additional charge operation and a necking operation (i.e., processes A and B), the cooler 19 is situated stationarily at a higher position away from the melt surface. After the necking operation has been completed, the cooler 19 is lowered to a predetermined position and comes to standstill (process C). At this time, the cooler 19 is moved at high speed for speeding up the work. If chucking of a seed crystal is again required, the cooler 19 is again lifted to a higher position, and the necking operation is again performed in this state.

Subsequently, a single crystal is pulled while the cooler has been lowered to a predetermined position (process D). Since the single crystal is pulled while being cooled, a pull rate can be increased. Here, after pulling of a single crystal has been completed, the cooler 19 is lifted at high speed (process E). In order to effect remelting of material, the cooler 19 is stopped at the higher position (process F). After completion of a remelting operation, the cooler 19 is lowered at high speed (process G), and a single crystal is pulled again (process H). In a tail process (process I), which is the final process of the single crystal pulling operation, the cooler 19 is lifted for reducing power consumption. In order to ensure sufficient melt, the cooler 19 is lifted at a slightly-lagged timing.

Next, at the time of a recharge operation (process J) being performed, the cooler 19 is lifted to a higher position for ensuring ease of recharge operation and preventing damage to furnace members, which would otherwise be caused by splashing of melt. After completion of the recharging operation, the cooler 19 is gain lowered at high speed (process K), and a single crystal is pulled (process L) In the event of occurrence of collision or accident, the cooler 19 is lifted immediately during the single crystal pulling process (i.e., process L), thus separating the cooler 19 away from the surface of a silicon melt. In the tail process (process M) subsequent to pulling of a single crystal, there is effected processing which is the same as that effected in the previously-described tail process (process I). Subsequently, the cooler 19 is lowered to a position within the crucible (process N), and the crucible is cooled (process O).

<Operation for Ensuring Safety and Avoiding Hazards>

In principle, as an operation for ensuring safety and avoiding hazards, the CZ single crystal puller according to the present invention moves the cooler away (to a retracted position) from a location where anomalies have arisen, a melt surface, or a single crystal being pulled. For example, if the expression "anomalies" signifies collision between the cooler 19 and another furnace member or a near miss arising between the cooler 19 and another furnace member, there is mentioned a method of temporarily moving the cooler 19 in reverse by a distance of about 5 mm. If the expression "anomalies" signifies collision between furnace members other than the cooler 19, or erroneous operations of the CZ single crystal puller, the cooler 19 is moved away from the single crystal 17 and the silicon melt 12, thereby avoiding hazards. Hence, the maintainability of the CZ single crystal puller is improved.

In this case, when the cooler 19 is moved away from hazardous areas typified by the single crystal 17 and the silicon melt 12, the cooler 19 is moved while a travel speed is switched to a higher speed (e.g., 30 mm/min. to 300 mm/min.), thus enabling immediate avoidance of hazards.

A mechanism and device for sensing anomalies can be embodied by means of detecting the temperature of cooling water circulating through the cooler, monitoring the internal temperature distribution of the CZ furnace, sensing relative positions of furnace members, sensing of a load imposed on a cooler or that imposed on a single crystal pulling motor, sensing variations in an abnormal weight, and sensing the amount of travel of a cooler through use of an encoder provided in a movable cooler. In the specification, the function and construction of a sensing mechanism and device, which device is employed in the CZ single crystal puller and ensures safety by means of sensing particularly moisture, will be described by reference to FIG. 1.

As shown in FIG. 1, the CZ single crystal puller according to the present embodiment comprises a pressure sensor 31 for tracing variations in the internal pressure of the chamber 11; a temperature sensor 33 for sensing variations in the temperature of a gas which is stored in the chamber 11 and is to be evacuated by the vacuum pump 20; and an infrared-ray sensor 34 for sensing infrared rays absorbed by the gas which is stored in the chamber 11 and is to be evacuated by the vacuum pump 20. In the event of water leakage arising in the pipe of the cooler 19, the leaked water is changed into steam by the heat in the furnace, and the steam in turn causes variations in temperature or pressure of the furnace. By means of sensing a change in temperature or pressure in the furnace, water leakage can be sensed accurately. Since steam absorbs infrared rays, the infrared-ray sensor 34 is provided for enhancing the accuracy of detection of water leakage by means of determining absorption of infrared rays.

If any one of the above-described sensors is disposed in the furnace, water leakage can be sensed sufficiently. However, in order to make all possible preparations for sensing water leakage, a plurality of sensors may be disposed in combination. For the same reason, a plurality of sensors of the same type may also be disposed.

Unless a comparatively large amount of steam is present, the temperature sensor 33 will fail to sense variations in temperature distinguishably from changes in another condition. For this reason, in order to accurately sense variations in temperature caused by steam, the temperature sensor 33 must be disposed in a position at which steam concentrates. Basically, the temperature sensor 33 is preferably disposed in an exhaust channel (i.e., a pipe connected to the vacuum pump 20). Since the infrared-ray sensor 34 can immediately sense a trace amount of steam, the sensor can be attached not only in the exhaust channel but anywhere, such as an interior wall surface of the chamber 11.

The sensors are connected to the controller 35. In the present embodiment, the pressure sensor 31 is connected directly to the controller 35. Further, the temperature sensor 33 is connected to the controller 35 by way of a corresponding processor 33a, and the infrared-ray sensor 34 is connected to the controller 35 by way of a corresponding processor 34a.

For example, if a rise in the internal pressure of the chamber 11 stemming from generation of steam has been sensed by the presser sensor 31, if the temperature sensor 33 has sensed an increase in the temperature of an exhaust gas resulting from generation of steam, if the infrared-ray sensor 34 has sensed abnormal absorption of infrared rays in the absorption range of steam or if all these situations have occurred simultaneously, the controller 35 is activated, to thereby illuminate an indicator 36. Further, the controller 35 closes a solenoid valve 37 for regulating inflow of cooling water, thus stopping inflow of cooling water. Simultaneously, another solenoid valve 39 which usually remains closed is opened, thereby opening the end of the exhaust pipe 21b to the atmosphere. In the event of occurrence of water leakage, leaked water is changed to steam, thus resulting in an increase in pressure. In this case, cooling water circulating through the cooler 19 is discharged to the outside by way of the solenoid valve 39, thereby diminishing the amount of water dropping into silicon melt.

The pipe to be released to the atmosphere is also connected to the supply tube 21a, and hence cooling water which is about to be supplied to the cooler 19 can also be discharged. By means of such a tube, in the event of occurrence of water leakage, the cooling water still remaining in the cooler 19 can be discharged in as great an amount as possible, thus lessening damage which would be inflicted on the CZ single crystal furnace. Even in such a case, closedown of the CZ single crystal furnace can be avoided. In order to make preparations against emergency, the chamber 11 of the CZ single crystal puller according to the present embodiment is provided with a safety valve 40. Further, check valves 41, 42, and 43 are attached to a cooling-water outlet pipe or a non-pressure pipe. Thus, all possible preparations against emergency are taken.

In the specification, "anomalies" arising in the CZ single crystal puller may imply, for example, detection of anomalies by operators, power failures, failures of a vacuum pump, failures of power supply for a heater, damage to furnace members, failures of a cooling-water pump, etc. If such "anomalies" arise, at least the motor 26a of the hoisting-and-lowering machine 25 is stopped. In some instances, the motor 26a is quickly rotated in reverse, thereby moving the cooler 19 in a reverse direction, thereby preventing occurrence of a more serious problem which would otherwise arise. Moreover, in order to avoid occurrence of a serious problem, in the event of occurrence of "anomalies," a cooler is moved at high speed (300 mm/min.) away from furnace members (i.e., the surface of a silicon melt and a single crystal), which would be dangerous were the cooler to approach them.

The CZ single crystal puller equipped with a cooler according to the present invention can prevent occurrence of problems, which would otherwise be caused at the time of a recharge operation or an additional charge operation, at the time of elimination of dislocations using the Dash's neck method, or by a cooler disposed within a CZ furnace for cooling a single crystal. The puller can provide solely a merit of speeding up of a crystal pull rate induced by a cooler. Hence, the CZ single crystal puller equipped with a cooler according to the present invention can reliably yield such an advantage of speeding up a crystal pull rate to 1.5 times that of the related-art CZ single crystal puller, without involvement of a demerit, which would otherwise be caused by a cooler.

More specifically, the CZ single crystal puller equipped with a cooler according to the present invention can lessen a problem of an increase in the energy consumed by a CZ single crystal puller equipped with a cooler. In the CZ single crystal puller equipped with a cooler such as that described herein, the crystal pull rate can be increased to 1.5 times the rate of a related-art CZ single crystal puller, by means of interposing a cooler between a crystal and a thermal insulation member for shielding the crystal from the heat originating from the material melt. However, such an increase in pull rate involves a problem of an increase in energy consumption. In contrast, in the CZ single crystal puller equipped with a cooler according to the present invention, a cooler (along with a thermal insulation member in some cases) is moved to a higher position at the time of a first melting operation, melting with additional charge, or melting with recharge. Hence, the output of the heater is diminished correspondingly, thereby suppressing an increase in energy consumption.

Further, the CZ single crystal puller equipped with a cooler according to the present invention solves problems which are posed by the durability of a quartz crucible and arise at the time of additional charge or recharge operation. When an additional charge or recharge operation is performed, the quartz crucible remains heated over a long period of time, which in turn involves problems of deterioration of the quartz crucible or durability. If a recharge operation has been performed, yield of crystal is deteriorated by an increase in the rate of collapse of a crystal (polycrystallization) after recharge operation. If an additional charge operation has been performed, yield of crystal is deteriorated by an increase in the rate of collapse of a crystal (polycrystallization) during the course of growth of the latter half of the crystal. In contrast, the CZ single crystal puller equipped with a cooler according to the present invention enables reliable increase of the crystal pull rate to 1.5 times or more that of the related-art CZ single crystal puller without involvement of a demerit, which would otherwise be posed by installation of a cooler, thus shortening the time for heating the quartz crucible. Therefore, the rate of elimination of dislocations can be increased for both a crystal produced through additional charge and a crystal produced through recharge. In terms of durability, until now use of an expensive synthetic quartz has been required, for avoiding an increase in the rate of polycrystallization. However, adoption of the present invention enables use of a natural quartz crucible.

Further, although the CZ single crystal puller according to the present invention is provided with a cooler, elimination of dislocations can be effected without fail, by use of the Dash's neck method. Hence, production efficiency is increased, thus contributing to reduction in production costs.

Even when furnace members are deformed as a result of long-term use, substantially identical requirements can be maintained by means of finely adjusting the distance between a melt surface and a cooler and the distance between a thermal insulation member and a cooler, thus enabling continuous production of crystal of stable quality.

[Safety Device]

As mentioned above, the present invention enables movement of the cooler disposed within a CZ furnace of the CZ single crystal puller. In the event of anomalies arising in the puller, the cooler is moved away from the area where the anomalies have arisen, thus enhancing safety of the puller.

<Operations for Ensuring Safety and Avoiding Hazards>

A basic safety protocol employed by the CZ single crystal puller according to the present invention for ensuring safety and avoiding hazards is to move a cooler away from an area where anomalies have arisen, a melt surface, or a pulled single crystal. More specifically, when "anomalies" correspond to collision or near miss arising between another furnace member and the cooler 19 in the course of vertical movement, there may be employed a procedure for temporarily moving the cooler 19 in reverse by 5 mm or thereabouts. If "anomalies" correspond to collision between furnace members other than the cooler 19 or faulty operations of the puller, the cooler 19 is moved away from the single crystal 17 or the silicon melt 12, thus avoiding hazards and enhancing the safety of the CZ single crystal puller.

In this case, when the cooler 19 is moved away from perilous areas typified by the pulled single crystal 17 and the silicon melt 12, the cooler 19 is moved by means of changing travel speed to a higher speed (e.g., 30 mm/min. to 300 mm/min.) thus enabling immediate avoidance of hazard.

<Specific Embodiments of a Safety Device>

A safety device provided in the CZ single crystal puller equipped with a cooler according to the present invention will now be described.

Figure 17:
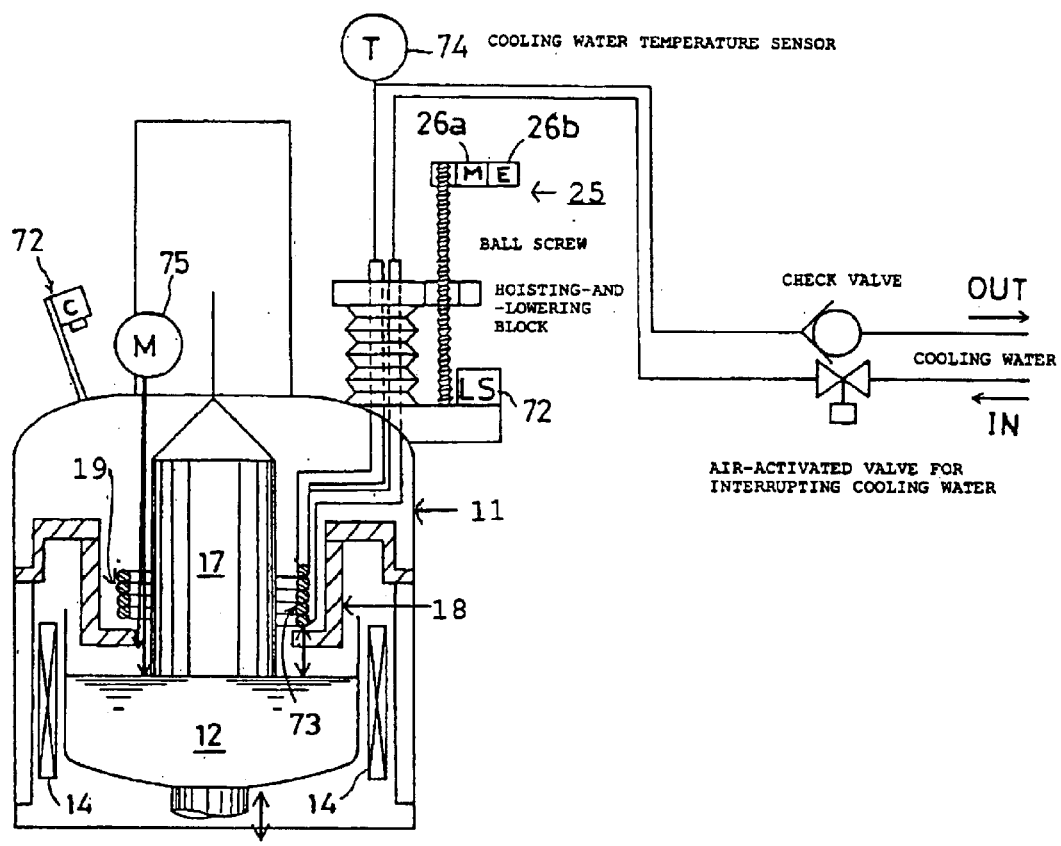
FIG. 17 is a block diagram for describing a safety device of the CZ single crystal puller equipped with a cooler according to the present invention.

FIG. 17 is a block diagram for describing a safety device of the CZ single crystal puller equipped with a cooler according to the present invention. In the drawing, those elements which are the same as the constituent elements shown in FIGS. 1 and 2 are assigned the same reference numerals, and repetition of their explanations is omitted. For the convenience of explanation, explanation is given of the safety device in the present embodiment by reference to the CZ single crystal puller having the vertically-movable cooler 19. However, it is obvious that the safety device can be applied to the cooler 119 which moves in inclined directions and to the pivotal cooler 219, without involvement of changes in the basic principle.

<Detection of Temperature>

The CZ single crystal puller equipped with a cooler according to the present invention is provided with a radiation thermometer/CCD camera 72 for two-dimensionally observing the inside of a CZ furnace by way of a window formed in the chamber 11. The radiation thermometer/CCD camera 72 acts as a thermograph for sensing the internal temperature distribution of the CZ furnace, thereby sensing any anomalous rise in the surface temperature of the cooler 19.

In the present embodiment, a temperature sensor 73 formed from a thermocouple is provided on the interior of the cooler 19. The temperature sensor 73 can also sense an anomalous rise in the surface temperature of the cooler 19. When the temperature sensor 73 is attached to the exterior of the cooler 19, the sensor can sense excessive heating of the heater 14.

As mentioned above, the CZ single crystal puller equipped with a cooler according to the present invention is provided with the radiation thermometer/CCD camera 72 or the temperature sensor 73, and either of these enables detection of an anomalous rise in the surface temperature of the cooler 19. In a case where an anomalous rise in the surface temperature of the cooler 19 has been detected, the cooler 19 is moved away at high speed (e.g., 300 mm/min.) from an area which is ascribable to the temperature rise (e.g., the pulled single crystal 17), thus avoiding occurrence of a serious accident.

According to one selective embodiment of the present invention, the CZ single crystal puller equipped with a cooler is provided with a thermometer 74 for detecting the temperature of the cooling water that has passed through the cooler 19. If the thermometer 74 has detected an anomalous rise in cooling water temperature, the cooler 19 is moved away from the location which is ascribable to the anomalous rise in the temperature of cooling water (e.g., the pulled single crystal 17 or the surface of silicon melt 12). In this case, the movement of the vertically-movable cooler 19 is limited to the vertical direction. Hence, movement of the cooler 19 away from the surface of silicon melt is predominant. However, in the case of the cooler 119 which moves in inclined directions and in the case of the pivotally-movable cooler 219, if the cooler is separable, the cooler can be moved away from the surface of the silicon melt 12 and from the pulled single crystal 17 simultaneously.

<Detection of Relative Position>

The CZ single crystal puller equipped with a cooler according to the present invention is provided with a melt level sensor 75 for sensing the level of a silicon melt. The melt level sensor 75 can measure, in addition to the level of the silicon melt, the distance between the bottom surface of the cooler 19 and the upper surface of the thermal insulation member 18, and the heights of ordinary furnace members. Accordingly, the melt level sensor 75 can detect near miss or collision between furnace members, which would otherwise be caused in association with vertical movement (hoisting and lowering action) of the cooler 19.

In a case of employment of a two-dimensional melt level sensor described in, for example, Japanese Patent Application Laid-Open No. 264779/2000, a vertical distance and a horizontal distance can be sensed. As a result, the melt level sensor can detect near miss or collision arising between the thermal insulation member 18 and the single crystal 17 and near miss or collision arising between the cooler 19 and the single crystal 17, as well as near miss or collision arising between the bottom of the cooler 19 and the thermal insulation member 18. A horizontal distance can be detected by means of the radiation thermometer/CCD camera 72.

As mentioned above, the CZ single crystal puller equipped with a cooler according to the present invention is provided with the melt level sensor 75 (particularly, the two-dimensional melt level sensor) or the radiation thermometer/CCD camera 72. Either of these enables detection of near miss or collision arising between the cooler 19 and the single crystal 17 or near miss or collision arising between furnace members. If near miss or collision has been detected during the hoisting or lowering operation, the motor 26a of the hoisting-and-lowering machine 25 immediately rotates in reverse, thus moving the cooler 19 in the reverse direction and avoiding occurrence of a serious accident. In some cases, as in the case of detection of temperature, the cooler 19 is moved at high speed (300 mm/min.) away from the surface of the silicon melt 12 and the pulled single crystal 17, thereby avoiding occurrence of a serious accident.

<Encoder>

The CZ single crystal puller equipped with a cooler according to the present invention is provided with an encoder 26b integrated with a motor 26a (see FIG. 2). The distance over which the cooler 19 is hoisted or lowered is traced by means of the encoder 26b.

On the basis of a value computed from the information (the distance over which the cooler 19 is hoisted or lowered) supplied from the encoder 26b, if there is detected near miss or collision arising between the cooler 19 in vertical motion and the pulled single crystal 17 (particularly in the case of the cooler 119 which moves in inclined directions or the pivotally-movable cooler 219), or near miss or collision arising between the cooler 19 and a material melt or another furnace member (in the case of any of the vertically-movable cooler 19, the cooler 119 which moves in inclined directions, and the pivotally-movable cooler 219), reverse rotation of the motor 26a or switching of travel speed of the cooler (speeding up of the cooler) is effected, thereby moving the cooler away from a perilous area, such as the location at which near miss or collision has been detected, the surface of silicon melt, or the pulled single crystal 17.

<Limiter Member>

The CZ single crystal puller equipped with a cooler according to the present invention is provided with a limiter switch (LS) 27 disposed at a position below the hoisting-and-lowering block 23a (FIG. 2). In the event that the hoisting-and-lowering block 23a has come into contact with the LS 27, the motor 26a is stopped immediately, thereby stopping lowering action of the cooler 19. In some cases, the motor 26a is actively rotated in reverse, thereby returning the cooler 19 to a higher position.

Here, the limiter switch (LS) 27 is in principle for setting a lower limit below which the cooler 19 is not lowered further (i.e., a limiter member). The size of the limiter switch LS 27 is set in accordance with the lower limit. In the present embodiment, a limiter switch which effects electrical control is employed as the limiter member. However, the limiter member may be embodied by a physical substance or a solid member such as a mere metal block, so long as the substance can limit lower movement of the hoisting-and-lowering block 23a below a predetermined location.

The CZ single crystal puller equipped with a cooler according to the present invention is provided with such a limiter member, whereby at least excessive lowering of the cooler 19 can be prevented by use of physical limitations. If the limiter member is constituted of a limiter switch, recovery of the cooler 19 from an excessively-lowered state can be effected immediately.

<Touch Sensor>

Figure 18:
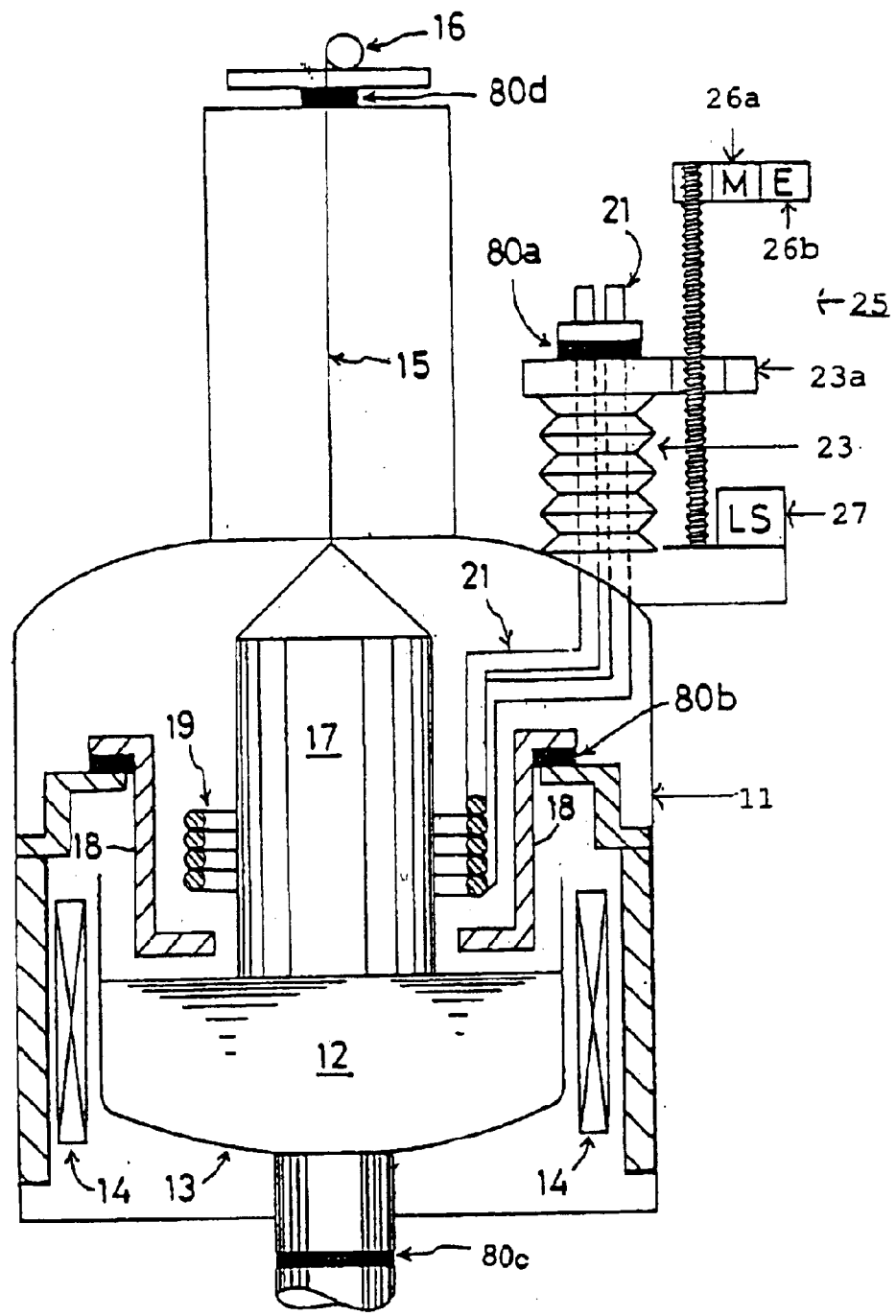
FIG. 18 is an illustration for describing the principle for constructing a touch sensor between members to be disposed within a furnace (furnace members)
Figure 19:
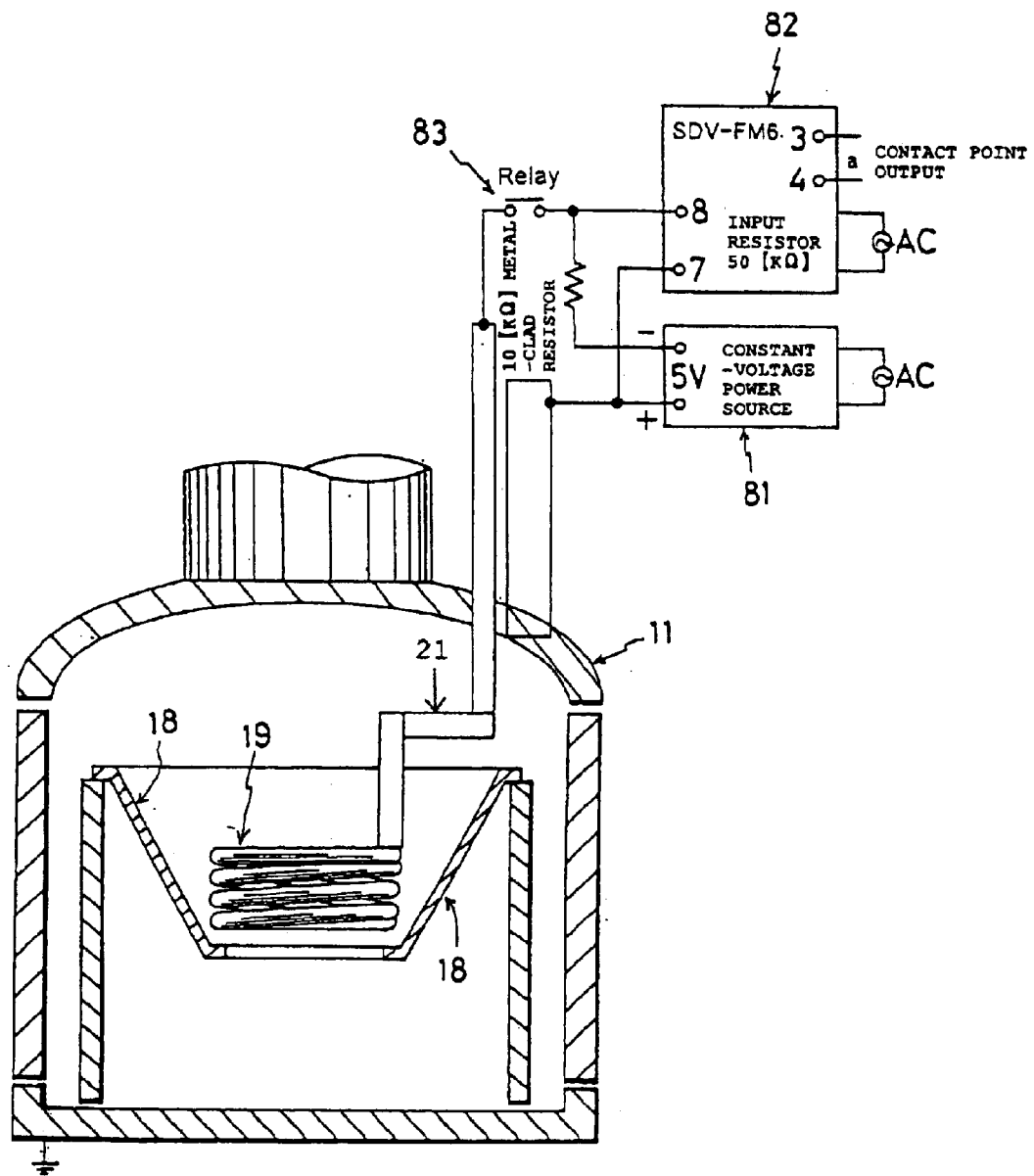
FIG. 19 is an illustration showing an example connection diagram used for constructing a touch sensor between the furnace members.

In order to accurately detect contact between furnace members (particularly contact between the cooler moving within the furnace and another furnace member), the CZ single crystal puller equipped with a cooler according to the present invention is configured so as to apply a constant voltage to members whose mutual contact is desired to be detected while the members are insulated, and to trace variations in the voltage. In short, a touch sensor is constructed over members whose mutual contact is to be detected. FIG. 18 shows the principle of the touch sensor, and FIG. 19 shows one example of a required schematic diagram. Although the present embodiment illustrates construction of a touch sensor of voltage measurement type, the previously-described touch sensor of current measurement type may be constructed. In the drawings, those elements which are the same as the constituent elements shown in FIGS. 1 and 2 are assigned the same reference numerals, and repetition of their explanations is omitted.

In order to detect contact between the cooler 19 and another furnace member, the cooler 19 is insulated from other furnace members. As shown in FIG. 18, insulation of the cooler 19 is implemented by means of attaching the supply-and-exhaust pipe 21 to the hoisting-and-lowering block 23a with an insulation member 80a sandwiched therebetween. Further, as shown in FIG. 18, in order to detect contact between the thermal insulation member 18 and another furnace member, an insulation member 80b is preferably attached to the base end of the thermal insulation member 18, and a wire is preferably connected to the thermal insulation member 18. Similarly, in order to detect contact of the crucible 13 and the silicon melt 12 with another furnace member, an insulation member 80c is preferably attached to a lower portion of the pedestal or a lower portion of a crucible shaft, and a wire is preferably connected to the crucible 13. In order to detect contact of the pulled single crystal 17 and the wire 15 for pulling the pulled single crystal 17 with another furnace member, an insulation member 80d is preferably interposed between a take-up machine 16 for taking up the wire 15 and the top of the chamber 11. A wire is connected to the take-up machine 16.

FIG. 19 is an example connection diagram used for constituting a touch sensor across furnace members. As shown in FIG. 19, in order to constitute a touch sensor between the cooler 19 and another furnace member and to detect contact therebetween, the cooler 19 is insulated from another furnace member through use of the insulation member 80a shown in FIG. 18. A constant voltage is applied between the cooler 19 and the furnace member. A constant-voltage power supply 81 applies a constant voltage. Preferably, one terminal of the constant-voltage power supply 81 is connected to the supply-and-exhaust pipe 21 of the cooler 19, and the other terminal of the constant-voltage power supply 81 is connected to the exterior wall of the chamber 11.

In the touch sensor circuit, a voltage detector 82 is connected in parallel to the constant-voltage power supply 81. In the present embodiment, the touch sensor circuit is further provided with a relay switch 83 which is activated only during the course of automatic operation. When the relay switch 83 is activated when automatic operation is performed, a touch sensor is formed at least between the cooler 19 and the chamber 11.

In this state, when the cooler 19 comes into contact with another furnace member, the voltage detector 82 detects a drop in voltage. Hence, so long as a voltage drop is traced by the voltage detector 82, near miss or collision between the cooler 19 and another furnace member or near miss or collision between furnace members can be detected. When such near miss or collision is detected, the motor 26a of the hoisting-and-lowering machine 25 is immediately rotated in reverse, thereby retracting the cooler 19, thus preventing occurrence of a serious accident. In some cases, as in the case of the embodiment in which temperature detection is effected, the cooler 19 is moved away from the surface of a silicon melt or the pulled single crystal 17 at high speed (300 mm/min.), thus avoiding occurrence of a serious accident.

In a case where the cooler 19 is insulated from other furnace members through use of the insulation member 80a and where the insulation members 80b through 80d are not provided in the furnace, only contact of the cooler 19 with another furnace member can be detected. However, the type of the furnace member that has come into contact with the cooler 19 cannot be determined. For this reason, the insulation members 80b, 80c, and 80d are provided, and corresponding constant-voltage power supplies and voltage detectors are connected to the insulation members 80b through 80d. As is obvious from the principle of the touch sensor according to the present invention, such a construction enables detection of contact between the thermal insulation member 18 and another furnace member, contact of the crucible 13 and the silicon melt 12 with another furnace member, and contact between the pulled single crystal 17 and the wire 15, in this sequence. In a case where all the insulation members 80a through 80d shown in FIG. 18 are provided on the corresponding furnace members, when the terminal of the constant-voltage power supply 81 is connected to the chamber 11 and contact is detected, the furnace member that has caused contact can be detected accurately, as has been described previously.

In a case where a touch sensor is constructed between furnace members in the CZ single crystal puller, the greater the number of insulation members 80 to be attached to the furnace and the greater the number of variations of the insulation members, the higher the accuracy of the touch sensor is increased. The number of insulation members 80 and variations thereof are determined in comprehensive consideration of the importance and level of emergency of the contact desired to be detected and economical merits. As a matter of course, wiring the constant-voltage power supply 81 and the voltage detector 82 to furnace members is considerably easy for a person skilled in the art, as in the case of connection between the supply-and-exhaust pipe 21 of the cooler 19 and the exterior wall surface of the chamber 11. Moreover, the number and locations of the insulation members 80 to be attached are not limited to the examples shown in FIG. 18.

Mention will be made here of the embodiment. In reality, contact resistance between the cooler 19 (made of stainless steel) and the thermal insulation member 18 (carbon) was measured to be 10Ω or less, and contact resistance between metal furnace members (made of stainless steel or other metal) was measured to be 10Ω or less. These resistance values are said to constitute substantially internal resistance of a circuit. It is evident that such resistance does not hinder the touch sensor from monitoring contact by means of detecting variations in voltage. Cooling water circulates through the cooler 19. When the present invention is implemented, resistance of cooling water must be taken into consideration. If resistance of cooling water assumes a value of 10 kΩ or thereabouts, consideration of potential electrical conduction of cooling water becomes less necessary.

More specifically, the insulation members 80a and 80d are to be attached outside the CZ furnace, and hence a commercially-available insulation material (e.g., Duracon™ or Delrin™) which is commonly used and commonly purchased can be adopted as material of the insulation member 80. In contrast, the insulation members 80b and 80c are to be mounted inside the CZ furnace, and hence they should preferably be formed from $SiO_2$ of high purity.

<Detection of Overload and Anomalous Variation in Weight>

In a common CZ single crystal puller, the single crystal 17 is pulled through use of the wire 15, and the wire 15 is taken up by the take-up machine 16. However, if a load cell attached to the pull head of the take-up machine 16 or a motor used for driving the take-up machine 16 is susceptible to overload, the CZ single crystal puller equipped with a cooler according to the present invention is constructed so as to stop at least the motor 26a of the hoisting-and-lowering machine 25. If the motor 26a used for driving the hoisting-and-lowering machine 25 is susceptible to overload, the hoisting-and-lowering machine 25 is constructed so as to stop at least the motor 26a. More preferably, when any of the motors is susceptible to overload, the motor 26a is immediately rotated in reverse, thereby retracting the cooler 19 in the reverse direction and thus avoiding occurrence of a serious accident. If necessary, the cooler 19 is moved away from the surface of the silicon melt 12 or the pulled single crystal 17 at high speed (300 mm/min.), as in the case of the embodiment in which temperature detection is effected, thus avoiding occurrence of a serious accident.

Detection of overload by a motor can be easily effected by use of only a servo motor, as is obvious for persons skilled in the art.

<Detection of Steam>

The CZ single crystal puller equipped with a cooler according to the present invention employs a cooler of water circulation type. Hence, the puller is equipped with a steam detection device for detecting steam originating from the CZ furnace. If the steam detection device has detected steam, the detection device acts so as to move the cooler away from the pulled single crystal.

More specifically, the CZ single crystal puller equipped with a cooler according to the present embodiment comprises the pressure sensor 31 for tracing variations in the internal pressure of the chamber 11; the temperature sensor 33 for sensing variations in the temperature of a gas which is stored in the chamber 11 and is to be evacuated by the vacuum pump 20; and the infrared-ray sensor 34 for sensing infrared rays absorbed by the gas which is stored in the chamber 11 and is to be evacuated by the vacuum pump 20. In the event of water leakage arising in the pipe of the cooler 19, the leaked water is changed into steam by the heat in the furnace, and the steam in turn causes variations in temperature or pressure of the furnace. By means of sensing a change in temperature or pressure in the furnace, water leakage can be sensed accurately. Since steam absorbs infrared rays, the infrared-ray sensor 34 is provided for enhancing the accuracy of detection of water leakage by means of determining absorption of infrared rays.

If any one of the above-described sensors is disposed in the furnace, water leakage can be sensed sufficiently. However, in order to make all possible preparations for sensing water leakage, a plurality of sensors may be disposed in combination. For the same reason, a plurality of sensors of the same type may also be disposed.

Unless a comparatively large amount of steam is present, the temperature sensor 33 will fail to distinguish variations in temperature from changes in another condition. For this reason, in order to accurately sense variations in temperature caused by steam, the temperature sensor 33 must be disposed at a position where steam concentrates. Basically, the temperature sensor 33 is preferably disposed in an exhaust channel (i.e., a pipe connected to the vacuum pump 20). Since the infrared-ray sensor 34 can immediately sense a trace amount of steam, the sensor can be attached not only in the exhaust channel but anywhere, such as an interior wall surface of the chamber 11.

The sensors are connected to the controller 35. In the present embodiment, the pressure sensor 31 is connected directly to the controller 35. Further, the temperature sensor 33 is connected to the controller 35 by way of a corresponding processor 33a, and the infrared-ray sensor 34 is connected to the controller 35 by way of a corresponding processor 34a.

For example, if a rise in the internal pressure of the chamber 11 stemming from generation of steam has been sensed by the presser sensor 31, if the temperature sensor 33 has sensed an increase in the temperature of an exhaust gas resulting from generation of steam, if the infrared-ray sensor 34 has sensed abnormal absorption of infrared rays in the absorption range of steam, or if several or all of these situations have occurred simultaneously, the controller 35 is activated, to thereby illuminate an indicator 36. Further, the controller 35 closes a solenoid valve 37 for regulating inflow of cooling water, thus stopping inflow of cooling water. Simultaneously, another solenoid valve 39 which usually remains closed is opened, thereby opening the end of the exhaust pipe 21b to the atmosphere. In the event of occurrence of water leakage, leaked water is changed to steam, thus resulting in an increase in pressure. In this case, cooling water circulating through the cooler 19 is discharged to the outside by way of the solenoid valve 39, thereby diminishing the amount of water dropping into silicon melt.

The pipe to be released to the atmosphere is also connected to the supply tube 21a, and hence cooling water which is about to be supplied to the cooler 19 can also be discharged. By means of such a tube, in the event of occurrence of water leakage, the cooling water still remaining in the cooler 19 can be discharged in as great an amount as possible, thus lessening damage which would be inflicted on the CZ single crystal furnace. Even in such a case, shutdown of the CZ single crystal furnace can be avoided. In order to make preparations against emergency, the chamber 11 of the CZ single crystal puller according to the present embodiment is provided with a safety valve 40. Further, check valves 41, 42, and 43 are attached to a cooling-water outlet pipe or a non-pressure pipe. Thus, all possible preparations against emergency are taken.

<Others>

In the specification, "anomalies" arising in the CZ single crystal puller may imply, for example, detection of anomalies caused by operators, power failures, failures of a vacuum pump, failures of power supply for a heater, damage to furnace members, failures of a cooling-water pump, etc.

If such "anomalies" arise, as shown in FIG. 2, at least the motor 26a of the hoisting-and-lowering machine 25 is stopped. In some instances, the motor 26a is quickly rotated in reverse, thereby moving the cooler 19 in a reverse direction, thereby preventing occurrence of a more serious problem which would otherwise arise. Moreover, in order to avoid occurrence of a serious problem, in the event of occurrence of "anomalies," a cooler is moved at high speed (300 mm/min.) away from furnace members (i.e., the surface of a silicon melt and a single crystal) that would be dangerous were the cooler to approach them.

As has been described above, even when a cooler through which cooling water circulates is disposed within the CZ furnace, the CZ single crystal puller according to the present invention accurately prevents near miss or contact between the cooler and a furnace member or retracts the cooler by means of detecting the near miss or contact, thus preventing damage to the cooler. Accordingly, there can be prevented occurrence of a serious accident, such as an explosion, which would otherwise be caused by expansion of cooling water in the cooler.

Further, the cooler is quickly moved away from a substance, such as a melt, which would act as a heat source, or from other dangerous locations. Hence, in the event of water leakage, there can be diminished damage which would otherwise be inflicted by water leakage.

Since the CZ single crystal puller according to the invention enables quick changing of position of the cooler as well as preparations for safety, the distance between the cooler and the level of a melt can be controlled during the course of pulling of a single crystal, as required. Thus, further increase in a single-crystal pull rate and an improvement in production efficiency can be implemented.

Even when furnace members are deformed as a result of long-term use, substantially identical requirements can be maintained by means of finely adjusting the distance between a melt surface and a cooler and the distance between a thermal insulation member and a cooler, thus enabling continuous production of crystal of stable quality.

[Palette (Combination) of Factors Relating to Miniaturization of Crystalline Imperfections]

The following three methods are effective as measures for miniaturizing crystalline imperfections during the course of crystal growth through use of two or more "factors" in combination.

1) Increasing the rate at which a crystal is to be cooled requires an increase in the temperature gradient of the crystal and an increase in pull rate. There is provided a method of providing a CZ single crystal puller equipped with a thermal insulation member for shielding crystal heat radiated from melt or a heater or a cooler for cooling the crystal.

2) A method of miniaturizing defects by means of addition of nitrogen to crystal during the course of crystal growth (where a defect density increases).

3) A method of applying a magnetic field to a growing crystal. When a magnetic field is applied to a crystal during the course of growth, natural convection flows arising in silicon melt in the vertical direction are suppressed, thereby resulting in an increase in the temperature gradient of a melt. Consequently, a pull rate is increased about 20% or there abouts over that obtained when no magnetic field is applied to the crystal during the course of growth, thereby yielding an advantage of an increase in cooling speed. As has been stated previously, oxygen concentration can be controlled over a wide range, thereby yielding an effect of controlling deposition of oxygen which would form gettering sites for gettering heavy metals.

As illustrated in an example to be described later, no interference or cancellation arises between disposition of a cooler, application of a magnetic field, and nitrogen doping; rather, an additive or synergistic effect can be expected. So long as requirements for the CZ single crystal puller are set through use of any one or several of the conditions in combination; that is, disposition of a cooler, nitrogen doping, and application of a magnetic field, sizes of crystal imperfections are controlled, thereby optimizing the characteristics of a post-heat-treatment wafer.

In connection with these factors, as a result of disposition and adjustment of the thermal insulation member, and adjustment of distance between the bottom of the thermal insulation member and the melt surface, neither interference nor cancellation arises in the disposition of a cooler and nitrogen doping.

In connection with a magnetic field, ripples in the surface of a melt surface disappear when a magnetic field is applied to the melt. When a magnetic field is applied to the melt surface, the thermal insulation member can be moved much closer to the melt surface. As a result of the thermal insulation member being located closer to the melt surface, the effect of shielding the crystal from heat can be enhanced, thereby increasing the temperature gradient of the crystal. Such an increase in temperature gradient contributes to miniaturization of crystalline imperfections or an increase in pull rate. Accordingly, in terms of the relationship between the disposition and adjustment of a thermal insulation member and a magnetic field, it is thought that a positive result will be yielded without involvement of a negative result. Hence, in principle, application of a magnetic field can be added to the palette for miniaturizing crystalline imperfections, along with disposition of the cooler and nitrogen doping.

In this regard, a method of reducing the sizes of defects by means of controlling a V/G ratio or controlling the diameter of an OSF ring (as described in Japanese Patent Application Laid-Open No 154095/2000) and a method of reducing the sizes of defects by means of increasing a cooling rate of a crystal (as described in Japanese Patent Application Laid-Open No. 208987/1998) encounter difficulty in achieving a cooling rate at which defects can be sufficiently reduced, for reasons of an increase in thermal capacity associated with an increase in the diameter of a crystal. In the case of use of only the nitrogen doping method, limitations are imposed on the concentration of nitrogen which can be present in a crystal. For this reason, if nitrogen is doped in a crystal to high concentration, deposition of oxygen is promoted. Since a DZ layer cannot be ensured, the doping level of nitrogen is limited. By means of appropriate combination of a cooler, nitrogen doping, and application of a magnetic field, there can be expected a potential solution to a problem which arises when only the cooling speed of crystal is increased and a problem which arises when solely nitrogen doping is used.

[Embodiments of Crystal Produced by Use of a Cooler]

Embodiments of crystal produced by use of a cooler are as follows:

TABLE 2

| | |
|---|---|
| 1 | Cooling rate in a crystalline-imperfection formation temperature zone is at least 5° C./min. |
| 2 | The size of defects arising in a single crystal is 110 nm or less. |
| 3 | The density of defects arising in a single crystal is $5 \times 10^6/cm^3$ or more. |
| 4 | Wafers are produced by means of subjecting to heat treatment slices Cut off the crystals that have been grown under the foregoing conditions (a desired wafer can be produced by determination of the temperature and time in accordance with an application). |
| 5 | A wafer which is produced under the foregoing conditions is characterized in that defects detected by the LST method are $1/cm^2$ or less in density. |

[Embodiments of crystal produced by use of a cooler and nitrogen doping]

Embodiments of crystal produced by use of a cooler and nitrogen doping are as follows:

TABLE 3

| | |
|---|---|
| 1 | The size of defects arising in a single crystal is 90 nm or less. |
| 2 | The density of defects arising in a single crystal is $1 \times 10^7/cm^3$ or more. |
| 3 | The concentration of oxygen in a single crystal is $12 \times 10^{17}$ atoms/$cm^3$ or Less. |
| 4 | Wafers are produced by means of subjecting to heat treatment slices cut off from the crystals that have been grown under the foregoing conditions (a desired wafer can be produced by determination of the temperature and time in accordance with an application). |
| 5 | A wafer which is produced under the foregoing conditions is characterized in that defects detected by the LST method are $1/cm^2$ or less in density. |

EXAMPLES

Figure 20A:
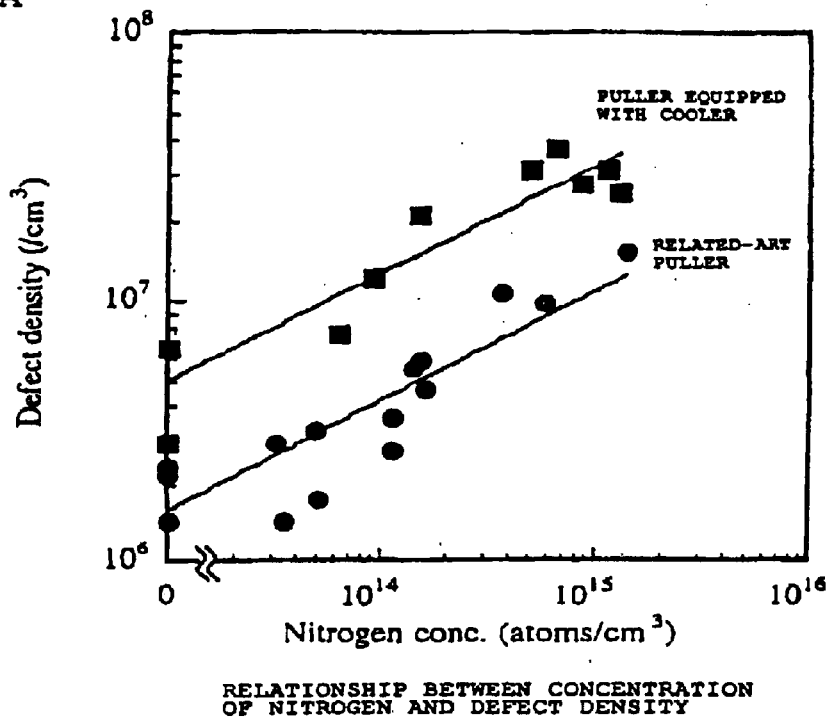
FIGS. 20A and 20B are graphs showing the relationship between defect density, defect size, and concentration of nitrogen when nitrogen is added to related-art requirements and when nitrogen is added to requirements for installing a cooler.

In the present example, there were produced two types of crystal according to related-art requirements and requirements for providing a cooler in a crystal puller, so as to satisfy the following specifications: employment of boron as a dopant, a diameter of 200 mm, p-type, crystal orientation of <100>, and a resistivity of 0 to 10 Ωcm. The relationship between defect density, defect sizes, and nitrogen concentration was checked with regard to the above two types of crystal when nitrogen is added to related-art requirements and when nitrogen is added to requirements for installing a cooler (FIGS. 20A and 20B).

Further, the relationship between cooling rate, defect density, and defect size was checked with regard to the above two types of crystal when nitrogen is added to related-art requirements and when nitrogen is added to requirements for installing a cooler (FIGS. 21A and 21B).

Further, mappings of typical LST surfaces and examples of defect density are also shown (FIG. 23). As a method for evaluating the LST surfaces, there was adopted a method for detecting crystalline imperfections at a depth of about 5 μm in a wafer surface, by means of radiating a visible-light laser (λ 690 nm, MO601 produced by Mitsui Mining & Smelting Co., Ltd.) on the surface of a wafer at an angle, and detecting the resultantly-scattered light through use of a CCD.

Figure 20B:
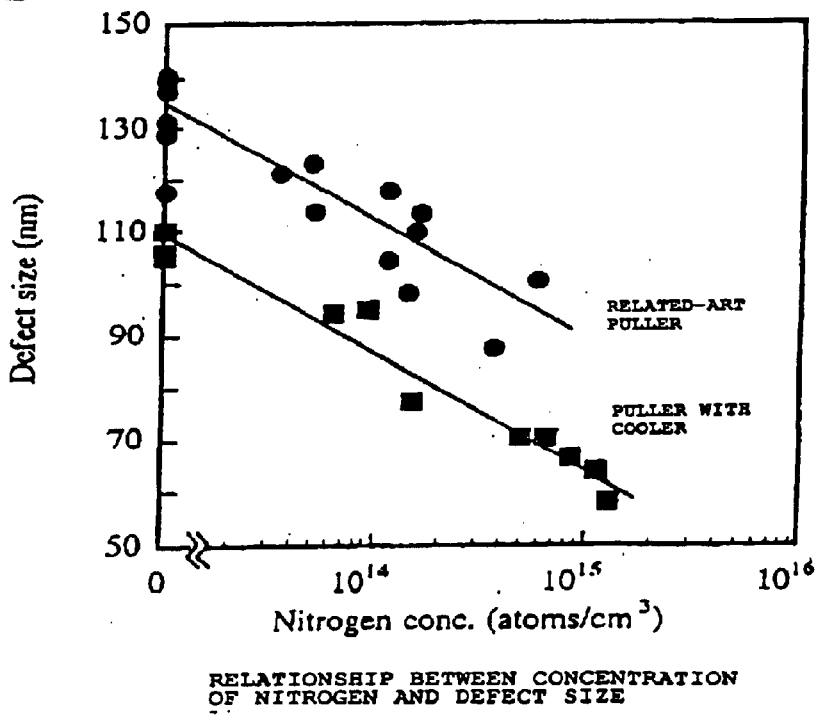

In FIG. 20B, it can be seen that miniaturization of crystalline imperfections associated with an increase in the doping level of nitrogen is accelerated by presence of a cooling member (i.e., a cooler). From FIG. 21B, it is understood that miniaturization of crystal imperfections associated with an increase in cooling speed is enhanced in association with an increase in the doping level of nitrogen. From these descriptions, it is understood that at least the effect of miniaturizing crystalline imperfections yielded by nitrogen doping can be sustained after disposition of a cooler.

Figure 22:
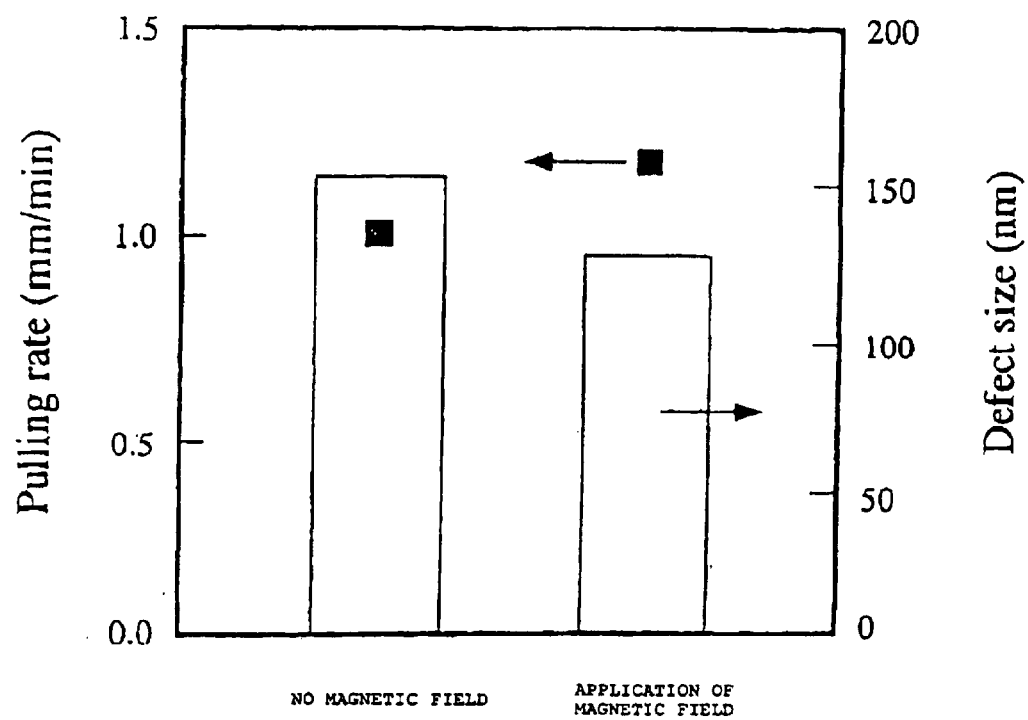
FIG. 22 is a graph showing the influence of application of a magnetic field on crystal growth rate and on defect size.

FIG. 22 is a graph showing the influence of application of a magnetic field on crystal growth rate and defect size. In the drawing, histograms show defect sizes (see the right-side vertical axis), and a solid square denotes a pull rate (the left-side vertical axis).

As shown in FIG. 22, when a magnetic field is applied to a crystal, miniaturization of defects and an increase in pull rate can be achieved simultaneously.

Therefore, it is understood that application of a magnetic field to a crystal positively affects a pull rate. As has been described previously, the melt surface is quelled by means of application of a magnetic field, and the bottom of the thermal insulation member is moved close to the melt surface, thus increasing the longitudinal temperature gradient of the crystal. As a result, it is thought that a pull rate can be improved. In any event, the pull rate can be actually increased by means of application of a magnetic field.

As shown in FIG. 23, a wafer is produced from the crystal which has been pulled through use of a cooler, by means of heat treatment. Further, another wafer is produced from the crystal which has been pulled through use of a cooler and nitrogen doping, by means of heat treatment. It is seen that defects formed in these two wafers are smaller than those formed in the wafer produced from a related-art crystal by means of heat treatment. It is understood that the density of defects arising in a wafer after annealing is considerably diminished by means of an improvement in a thermal insulation member, use of a cooler, or combination of a cooler and nitrogen doping. The heat treatment atmosphere required for effecting annealing can be embodied by a non-oxidizing Ar atmosphere, an He atmosphere, or a mixed gas atmosphere consisting of hydrogen, Ar, and He.

[A Puller Operating According to a Predetermined Program]

A storage medium having stored therein data such as those shown in the following table 4 is housed in the silicon single crystal puller according to the present invention. On the basis of the data, a silicon single crystal is pulled. In the table, data pertaining to factor "Disposition and adjustment of a cooler" are specified as data S-D1 for speeding up a crystal pull rate. Data pertaining to factor "Adjustment of a hot zone" are specified as data S-D2 for speeding up a crystal pull rate. Data pertaining to factor "Disposition and adjustment of a thermal insulation member" are specified as data S-D3 for speeding up a crystal pull rate. Data pertaining to factor "Adjustment of distance between the bottom of the thermal insulation member and the melt surface" are specified as data S-D4 for speeding up a crystal pull rate. Data pertaining to factor "Application and adjustment of a magnetic field" are specified as data S-D5 for speeding up a crystal pull rate. These data sets are also specified as K-D1, K-D2, K-D3, K-D4, and K-D5 data pertaining to miniaturization of crystalline imperfections. Further, the data sets are specified as SK-D1, SK-D2, SK-D3, SK-D4, and SK-D5 data pertaining to both speeding up of a crystal pull rate and miniaturization of crystalline imperfections.

Here, data pertaining to factor "Adjustment of Doping Level of Nitrogen" are irrelevant to speeding up of a crystal pull rate. Hence, the data are not specified as "S-D" or "SK-D."; the data are specified as merely K-D6 pertaining to miniaturization of crystalline imperfections.

These data sets basically represent accumulation of data of the past. If necessary, the data may be updated, regardless of whether the data are computed values or measured values.

TABLE 4

| Speedup | Miniaturization | Speedup + Miniaturization | Factors |
|---|---|---|---|
| S-D1 | K-D1 | SK-D1 | Installation and adjustment of a cooler |
| S-D2 | K-D2 | SK-D2 | Adjustment of hot zone |
| S-D3 | K-D3 | SK-D3 | Installation and adjustment of thermal insulation member |
| S-D4 | K-D4 | SK-D4 | Adjustment of distance between bottom of thermal insulation member and melt surface |
| S-P5 | K-D5 | SK-D5 | Application and adjustment of magnetic field |
|  | K-D6 |  | Adjustment of doping level of nitrogen |

As illustrated in the following table, the data correspond to the program which controls the factors by reference to the data. The storage medium having stored therein the data provided in Table 4 and the storage medium having recorded thereon the program corresponding to the data shown in Table 4 may be stored in the puller. Alternatively, the storage mediums maybe stored outside the puller and carried for use, as required.

TABLE 5

| Data | Corresponding Program |
|---|---|
| Speedup | |
| S-D1 | S-P1 |
| S-D2 | S-P2 |
| S-D3 | S-P3 |
| S-D4 | S-P4 |
| S-D5 | S-P5 |
| Miniaturization | |
| K-D1 | K-P1 |
| K-D2 | K-P2 |
| K-D3 | K-P3 |
| K-D4 | K-P4 |
| K-D5 | K-P5 |
| K-D6 | K-P6 |
| Speedup + Miniaturization | |
| SK-D1 | SK-P1 |
| SK-D2 | SK-P2 |
| SK-D3 | SK-P3 |
| SK-D4 | SK-P4 |
| SK-D5 | SK-P5 |

When the puller according to the present invention is activated, initial data are loaded into the puller, and an appropriate factor is selected from the data palette shown in Table 5. Here, the data to be initially loaded correspond to the size of a crucible, the amount of material to be charged initially, the length and diameter of a desired crystal, a crystal, and the number of rotations of the crucible.

When an appropriate factor has been selected from the data palette shown in Table 5, a program corresponding to the thus-selected data is started, thereby arranging the internal environment of the puller (e.g., the geometry of a hot zone). A rate at which a single crystal is to be pulled is set to the maximum speed which is assumed to be possible in the thus-arranged environment. A silicon single crystal is pulled while fine adjustment is being performed during the course of pulling operation.

By means of activating the puller, a silicon ingot or silicon wafers can be produced at a speed higher than that which has been expected thus far. Many of the thus-produced silicon ingot or wafers involve smaller defects. Hence, such a silicon ingot or the wafers are suitable for use as wafers for annealing purpose.

By means of the silicon wafer production method according to the present invention, there are devised measures for miniaturizing defects which would arise and grow in a crystal growth step and measures for effecting high-speed pulling of crystal, in order to optimize, by means of high-temperature treatment, a perfect region in a wafer surface which is important for determining the characteristic of a device. A great effect can be yielded by means of use of the measures in combination.

As mentioned previously, perfection of a wafer surface layer can be expected by means of increasing the temperature of heat treatment or extending the time of heat treatment. However, these methods involve problems of contamination of a wafer with heavy metals due to an increase in heat treatment, wafer slippage, and a cost hike resulting from extension of the time of heat treatment. In terms of elimination of the demerits ascribable to these requirements for heat treatment, the silicon wafer production method according to the present invention can be said to yield a great effect.

Further, a device structure can be roughly divided into two types; that is, a stacked structure and a trench structure. According to the type of structure, the depth of a perfect region in a wafer surface layer required for a device changes. In terms of optimization of wafer quality according to the application thereof, the silicon wafer production method according to the present invention can be said to be an effective method.

What is claimed is:

1. A method of enabling adjustment for eliminating defects by use of the Dash's neck method, by means of arranging a cooler in a CZ furnace for cooling a pulled single crystal provided in an apparatus for pulling single crystal by Czochralski (CZ) method comprising moving the cooler within the furnace during the Dash's neck method.

2. A method of enhancing the efficiency of eliminating dislocation by use of the Dash's neck method, by means of moving a cooler within a CZ furnace for cooling a pulled single crystal away from a silicon melt surface while drawing a seed by use of the Dash's neck method.

3. The method as defined in claim 2 is characterized in that a thermal insulation member is moved away from a silicon melt surface along with the cooler.

4. A method of moving a cooler within a CZ furnace for cooling a pulled single crystal which is disposed in an apparatus for pulling single crystal by CZ method, for the purpose of enhancing the efficiency of elimination of dislocations by use of the Dash's neck method.

5. An apparatus for pulling a single crystal by Czochralski (CZ) method within a CZ furnace having a cooler for cooling a pulled single crystal, and a hoisting-and-lowering apparatus for hoisting or lowering the cooler within the CZ furnace, wherein the hoisting-and-lowering apparatus hoists the cooler to a higher position while drawing a seed according to the Dash's neck method.

6. A silicon ingot produced by the apparatus for pulling single crystal by the CZ method as defined in claim 5.

7. A silicon wafer sliced off from the silicon ingot as defined in claim 6.

8. An apparatus for pulling a single crystal by Czochralski (CZ) method having a cooler within a CZ furnace for cooling a pulled single crystal, a hoisting-and-lowering apparatus for hoisting or lowering the cooler within the CZ furnace, and a thermal insulation member for surrounding a single crystal, being disposed in the CZ furnace in a portable manner, wherein the hoisting-and-lowering apparatus hoists the cooler and the thermal insulation member to higher positions while drawing a seed according to the Dash's neck method.

9. The apparatus for pulling a single crystal by the CZ method of claim 8 wherein the cooler has a first engagement member and the thermal insulation member has a second engagement member and that, when the cooler is hoisted, the first and second engagement members are engaged with each other, and the thermal insulation member is lifted in association with upward movement of the cooler.

10. A silicon ingot produced by the apparatus for pulling single crystal by the CZ method as defined in claim 9.

11. A silicon wafer sliced off from the silicon ingot as defined in claim 10.

12. A silicon ingot produced by the apparatus for pulling single crystal by the CZ method as defined in claim 8.

13. A silicon wafer sliced off from the silicon ingot as defined in claim 12.

14. An apparatus for pulling single crystal by Czochralski (CZ) method having a crucible which is freely movable in the vertical direction and stores silicon melt and a cooler for cooling a pulled single crystal, wherein a seed is drawn by use of the Dash's neck method while the crucible is lowered and the cooler is moved away from the surface of the silicon melt.

15. A silicon ingot produced by the apparatus for pulling single crystal by the CZ method as defined in claim 14.

16. A silicon wafer sliced off from the silicon ingot as defined in claim 15.

17. An apparatus for pulling single crystal by Czochralski (CZ) method having a crucible which is freely movable in the vertical direction and stores silicon melt, a cooler for cooling a pulled single crystal, and a thermal insulation member for surrounding a silicon single crystal pulled from the silicon melt, wherein a seed is drawn by use of the Dash's neck method while the crucible is lowered and while the cooler and the bottom surface of the thermal insulation member are moved away from the surface of the silicon melt.

18. A silicon ingot produced by the apparatus for pulling single crystal by the CZ method as defined in claim 17.

19. A silicon wafer sliced off from the silicon ingot as defined in claim 18.

* * * * *